(12) United States Patent
Agarwal

(10) Patent No.: US 6,780,706 B2
(45) Date of Patent: Aug. 24, 2004

(54) SEMICONDUCTOR CONTAINER STRUCTURE WITH DIFFUSION BARRIER

(75) Inventor: Vishnu K. Agarwal, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/267,499

(22) Filed: Oct. 9, 2002

(65) Prior Publication Data

US 2003/0047808 A1 Mar. 13, 2003

Related U.S. Application Data

(62) Division of application No. 09/364,852, filed on Jul. 30, 1999, now Pat. No. 6,465,828.

(51) Int. Cl.[7] .......................................... H01L 21/8242
(52) U.S. Cl. ...................... 438/240; 438/250; 438/393
(58) Field of Search ................................ 438/240, 250, 438/253, 393, 396

(56) References Cited

U.S. PATENT DOCUMENTS

| | | | |
|---|---|---|---|
| 5,070,036 A | 12/1991 | Stevens | ...................... 437/190 |
| 5,381,302 A | 1/1995 | Sandhu et al. | ............... 361/305 |
| 5,392,189 A | 2/1995 | Fazan et al. | ................ 361/305 |
| 5,406,447 A | 4/1995 | Miyazaki | .................... 301/313 |
| 5,478,772 A | 12/1995 | Fazan | .......................... 437/60 |
| 5,506,166 A | * 4/1996 | Sandhu et al. | ............... 438/396 |
| 5,520,992 A | 5/1996 | Douglas et al. | ............. 428/209 |
| 5,618,746 A | 4/1997 | Hwang | ............................ 438/3 |
| 5,625,233 A | 4/1997 | Cabral, Jr. et al. | .......... 257/771 |
| 5,661,072 A | 8/1997 | Jeng | ............................ 438/439 |
| 5,663,088 A | 9/1997 | Sandhu et al. | ............... 438/396 |
| 5,665,628 A | 9/1997 | Summerfelt | ................... 438/3 |
| 5,707,898 A | 1/1998 | Keller et al. | ................. 438/265 |
| 5,708,302 A | 1/1998 | Azuma et al. | ............... 257/751 |

(List continued on next page.)

FOREIGN PATENT DOCUMENTS

| | | | | |
|---|---|---|---|---|
| JP | 61199657 A | * | 9/1986 | ........... H01L/27/10 |
| WO | WO-96/36993 | | 11/1996 | ........... H01L/21/70 |

OTHER PUBLICATIONS

Liu, W.–T..,et al. ,"Low–Temperature Fabrication of Amorphous BaTiO3 Thin–Film Bypass Capacitors", *IEEE Electron Device Letters, 14*, New York,(Jul., 1993),.320–322.

Yamamichi, Shintaro.,et al. ,"A stacked capacitor technology with ECR plasma MOCVD (Ba, Sr)TiO3 and RuO2, Ru/TiN/TiSix storage nodes for Gb–Scale DRAM's", *IEEE Transactions on Electron Devices, 44*(7), (Jul. 1997),pp. 1076–1083.

*Primary Examiner*—Tom Thomas
*Assistant Examiner*—Paul E Brock, II
(74) *Attorney, Agent, or Firm*—Schwegman, Lundberg, Woessner & Kluth, P.A.

(57) ABSTRACT

Container structures for use in integrated circuits and methods of their manufacture. The container structures include a bottom conductive layer, a top conductive layer and a dielectric layer interposed between the bottom conductive layer and the top conductive layer. The container structures further include a diffusion barrier layer interposed between the dielectric layer and the bottom conductive layer. The diffusion barrier layer acts to inhibit atomic diffusion to at least a portion of the bottom conductive layer, particularly atomic diffusion of oxygen during formation or annealing of the dielectric layer. The container structures are especially adapted for use as container capacitors. The container capacitors are further adapted for use in memory cells and apparatus incorporating such memory cells, as well as other integrated circuits.

36 Claims, 19 Drawing Sheets

U.S. PATENT DOCUMENTS

| | | | |
|---|---|---|---|
| 5,726,471 A | 3/1998 | Keller et al. | 257/316 |
| 5,729,054 A | 3/1998 | Summerfelt et al. | 257/751 |
| 5,739,579 A * | 4/1998 | Chiang et al. | 257/635 |
| 5,744,832 A | 4/1998 | Wolters et al. | 257/295 |
| 5,759,881 A | 6/1998 | Manning | 438/199 |
| 5,773,314 A | 6/1998 | Jiang et al. | 438/3 |
| 5,780,891 A | 7/1998 | Kauffman et al. | 257/316 |
| 5,828,092 A | 10/1998 | Tempel | 257/295 |
| 5,851,896 A | 12/1998 | Summerfelt | 438/396 |
| 5,858,851 A | 1/1999 | Yamagata et al. | 438/396 |
| 5,859,760 A | 1/1999 | Park et al. | 361/313 |
| 5,874,770 A | 2/1999 | Saia et al. | 257/536 |
| 5,925,918 A | 7/1999 | Wu et al. | 257/413 |
| 5,939,741 A | 8/1999 | Clampitt et al. | 257/278 |
| 5,949,117 A | 9/1999 | Sandhu et al. | 257/410 |
| 5,959,327 A | 9/1999 | Sandhu et al. | 257/310 |
| 5,970,309 A | 10/1999 | Ha et al. | 438/3 |
| 5,980,977 A | 11/1999 | Deng et al. | 427/79 |
| 5,985,719 A | 11/1999 | Keller et al. | 438/265 |
| 5,998,290 A | 12/1999 | Wu et al. | 438/595 |
| 6,030,847 A | 2/2000 | Fazan et al. | 438/3 |
| 6,066,528 A | 5/2000 | Fazan et al. | 438/253 |
| 6,069,059 A | 5/2000 | Pan et al. | 438/451 |
| 6,075,274 A | 6/2000 | Wu et al. | 257/413 |
| 6,080,672 A | 6/2000 | Juengling et al. | 438/692 |
| 6,087,263 A | 7/2000 | Clampitt et al. | 438/700 |
| 6,090,670 A | 7/2000 | Sandhu et al. | 438/286 |
| 6,201,276 B1 | 3/2001 | Agarwal et al. | 257/315 |
| 6,207,489 B1 | 3/2001 | Nam et al. | 438/240 |
| 6,208,569 B1 | 3/2001 | Patel et al. | 365/200 |
| 6,348,420 B1 | 2/2002 | Raaijmakers et al. | 438/769 |
| 6,417,537 B1 | 7/2002 | Yang et al. | 257/310 |

* cited by examiner

SEMICONDUCTOR CONTAINER STRUCTURE WITH DIFFUSION BARRIER

This application is a Divisional of U.S. application Ser. No. 09/364,852, filed Jul. 30, 1999, now U.S. Pat. No. 6,465,828 which is incorporated herein by reference.

TECHNICAL FIELD

The present invention relates generally to development of semiconductor container structures, and in particular to development of semiconductor container capacitor structures having a diffusion barrier, and apparatus making use of such container capacitor structures.

BACKGROUND

Many electronic systems include a memory device, such as a Dynamic Random Access Memory (DRAM), to store data. A typical DRAM includes an array of memory cells. Each memory cell includes a capacitor that stores the data in the cell and a transistor that controls access to the data. The capacitor typically includes two conductive plates separated by a dielectric layer. The charge stored across the capacitor is representative of a data bit and can be either a high voltage or a low voltage. Data can be either stored in the memory cells during a write mode, or data may be retrieved from the memory cells during a read mode. The data is transmitted on signal lines, referred to as digit lines, which are coupled to input/output (I/O) lines through transistors used as switching devices. Typically, for each bit of data stored, its true logic state is available on an I/O line and its complementary logic state is available on an I/O complement line. However, each such memory cell is coupled to, or associated with, only one digit line of a digit line pair through an access transistor.

Typically, the memory cells are arranged in an array and each cell has an address identifying its location in the array. The array includes a configuration of intersecting conductive lines, and memory cells are associated with the intersections of the lines. In order to read from or write to a cell, the particular cell in question must be selected, or addressed. The address for the selected cell is represented by input signals to a word line or row decoder and to a digit line or column decoder. The row decoder activates a word line in response to the word line address. The selected word line activates the access transistors for each of the memory cells in communication with the selected word line. The column decoder selects a digit line pair in response to the digit line address. For a read operation, the selected word line activates the access transistors for a given word line address, the charge of the selected memory cells are shared with their associated digit lines, and data is sensed and latched to the digit line pairs.

As DRAMs increase in memory cell density, there is a continuing challenge to maintain sufficiently high storage capacitance despite decreasing memory cell area and its accompanying capacitor area, since capacitance is generally a function of plate area. Additionally, there is a continuing goal to further decrease memory cell area.

A principal method of increasing cell capacitance is through cell structure techniques. Such techniques include three-dimensional cell capacitors, such as trenched or stacked capacitors. One common form of stacked capacitor structure is a cylindrical container stacked capacitor, with a container structure forming the bottom plate of the capacitor. Such container structures may have shapes differing from a substantially cylindrical form, such as an oval or other three-dimensional container. The container structures may further incorporate fins.

Another method of increasing cell capacitance is through the use of high dielectric constant material in the dielectric layer of the capacitor. In order to achieve the charge storage efficiency generally needed in 256 megabit(Mb) memories and above, materials having a high dielectric constant, and typically dielectric constants greater than 50, can be used in the dielectric layer between the bottom plate and the top plate of the capacitor. The dielectric constant is a characteristic value of a material and is generally defined as the ratio of the amount of charge that can be stored in the material when it is interposed between two electrodes relative to the charge that can be stored when the two electrodes are separated by a vacuum.

Unfortunately, high dielectric constant materials are often incompatible with existing processes. This incompatibility is a result of the oxygen-containing ambient often present during the deposition of high dielectric constant materials or during subsequent annealing steps.

For the reasons stated above, and for other reasons stated below which will become apparent to those skilled in the art upon reading and understanding the present specification, there is a need in the art for an improved container structure and methods of producing same.

SUMMARY

In one embodiment, the invention includes a semiconductor container structure. The semiconductor container structure includes a bottom conductive layer having a closed bottom portion and sidewall portions extending upward from the bottom portion, a diffusion barrier layer overlying at least the bottom portion of the bottom conductive layer, and a dielectric layer overlying the diffusion barrier layer and the bottom conductive layer. In a further embodiment, the dielectric layer contains at least one metal oxide material. The diffusion barrier layer acts to inhibit atomic diffusion to at least a portion of the bottom conductive layer. In another embodiment, the diffusion barrier layer contains one or more refractory metal nitride, silicon oxide, silicon nitride or silicon oxynitride materials. In a further embodiment, the bottom conductive layer includes a primary conductive layer overlying a conductive barrier layer. In a still further embodiment, the conductive barrier layer comprises a metal nitride. In another embodiment, the primary conductive layer contains a metal layer, a metal alloy layer or a conductive metal oxide layer. In a further embodiment, the primary conductive layer contains one or more metals of the refractory metals, the platinum metals group and the noble metals group. The one or more metals may be in the form of the metal, a metal alloy or a conductive metal oxide. In yet another embodiment, the diffusion barrier layer is adjacent the bottom portion of the bottom conductive layer, and the dielectric layer is adjacent the sidewall portions of the bottom conductive layer. In a still further embodiment, the dielectric layer contains one or more $Ba_xSr_{(1-x)}TiO_3$, $BaTiO_3$, $SrTiO_3$, $PbTiO_3$, $Pb(Zr,Ti)O_3$, $(Pb,La)(Zr,Ti)O_3$, $(Pb,La)TiO_3$, $Ta_2O_5$, $KNO_3$ or $LiNbO_3$ dielectric materials.

In another embodiment, the invention includes a semiconductor container structure. The semiconductor container structure includes a bottom conductive layer having a closed bottom portion and sidewall portions extending upward from the bottom portion, and a diffusion barrier layer overlying at least the bottom portion of the bottom conductive layer and exposing a remaining portion of the bottom conductive layer. The semiconductor container structure further includes a dielectric layer overlying the diffusion barrier layer and the bottom conductive layer, wherein the dielectric layer is adjacent the remaining portion of the bottom conductive layer.

In a further embodiment, the invention includes a semiconductor container structure. The semiconductor container structure includes a bottom conductive layer comprising a metal layer and having a closed bottom portion and sidewall portions extending upward from the bottom portion and a diffusion barrier layer overlying at least the bottom portion of the bottom conductive layer. The diffusion barrier layer contains at least one of silicon oxide, silicon nitride, silicon oxynitride and refractory metal nitride materials. The semiconductor container structure further includes a dielectric layer overlying the diffusion barrier layer and the bottom conductive layer.

In a further embodiment, the invention includes a method of forming a semiconductor structure. The method includes forming an insulating layer on a substrate and forming an opening in the insulating layer. The opening has a bottom portion overlying an exposed portion of the substrate and sidewall portions defined by the insulating layer. The method further includes forming a bottom conductive layer overlying the insulating layer and the bottom portion of the opening, forming a diffusion barrier layer overlying at least a portion of the bottom conductive layer, and forming a dielectric layer overlying the diffusion barrier layer and the bottom conductive layer. The diffusion barrier layer acts to inhibit atomic diffusion to at least a portion of the bottom conductive layer. In another embodiment, the bottom conductive layer includes a metal layer overlying a conductive barrier layer. In a further embodiment, the conductive barrier layer includes a metal nitride. In a still further embodiment, the bottom conductive layer includes one or more metals of the refractory metals, the platinum metals group and the noble metals group. In still another embodiment, the diffusion barrier layer includes one or more refractory metal nitride, silicon oxide, silicon nitride or silicon oxynitride materials. In yet another embodiment, the dielectric layer contains at least one metal oxide material. In a still further embodiment, the dielectric layer contains one or more $Ba_xSr_{(1-x)}TiO_3$, $BaTiO_3$, $SrTiO_3$, $PbTiO_3$, $Pb(Zr,Ti)O_3$, $(Pb,La)(Zr,Ti)O_3$, $(Pb,La)TiO_3$, $Ta_2O_5$, $KNO_3$ or $LiNbO_3$ dielectric materials.

Further embodiments of the invention include semiconductor structures and methods of varying scope, as well as apparatus, devices, modules and systems making use of such semiconductor structures and methods.

BRIEF DESCRIPTION OF THE DRAWINGS

FIGS. 3A–3L are cross-sectional views of a portion of the memory device of FIG. 2 at various processing stages.

DESCRIPTION OF THE EMBODIMENTS

In the following detailed description of the preferred embodiments, reference is made to the accompanying drawings which form a part hereof, and in which is shown by way of illustration specific embodiments in which the inventions may be practiced. These embodiments are described in sufficient detail to enable those skilled in the art to practice the invention, and it is to be understood that other embodiments may be utilized and that process or mechanical changes may be made without departing from the scope of the present invention. The terms wafer and substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions. The following detailed description is, therefore, not to be taken in a limiting sense, and the scope of the present invention is defined only by the appended claims.

Effects of Atomic Diffusion

The oxygen-containing ambient often present during the deposition of high dielectric constant materials or during subsequent annealing steps has been found to produce detrimental effects in some advanced capacitor structures. The atomic diffusion of oxygen may reach the polysilicon plug, or contact, often used for electrical contact to the bottom plate of the capacitor. Such atomic diffusion of oxygen includes diffusion of diatomic oxygen ($O_2$), ozone ($O_3$), oxygen radicals ($O^-$) and other oxidizing compounds or radicals. Examples of contact materials, in addition to polysilicon, that are susceptible to detrimental oxidation include tungsten (W), titanium nitride (TiN), tungsten nitrides ($WN_x$), tantalum nitride (TaN) and aluminum (Al).

Oxygen contamination of the contact, such as atomic diffusion through the bottom plate, can lead to interfacial oxide between the contact and the bottom plate. The interfacial oxide creates a capacitance between the contact and the bottom plate that is in series with the capacitance between the bottom plate and the top plate of the capacitor. Because the interfacial capacitance is much less than the plate capacitance, the interfacial capacitance will tend to dominate the capacitance of the capacitor structure. This can be illustrated with reference to FIGS. 1A–1D.

Figure 1A:
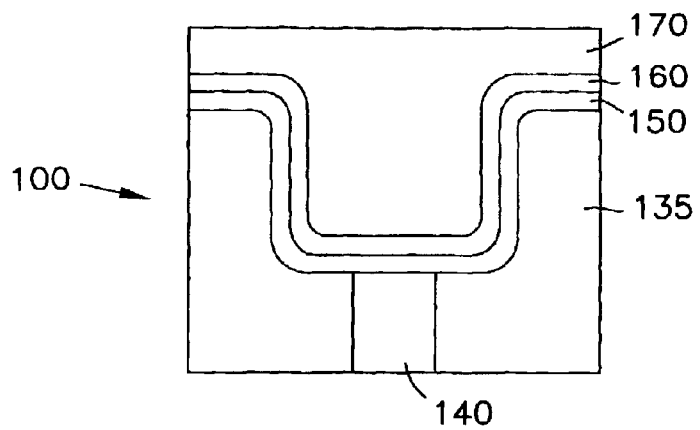
FIG. 1A is a cross-sectional view of a container capacitor.
Figure 1B:
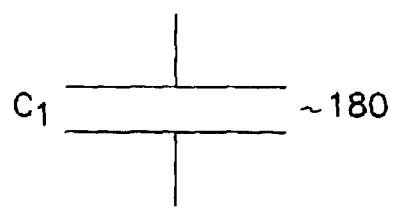
FIG. 1B is a circuit diagram of the container capacitor of FIG. 1A.

FIG. 1A is a cross-sectional view of a container capacitor 100. Container capacitor 100 includes a conductive bottom plate 150, a dielectric layer 160 and a conductive top plate 170. Electrical contact to bottom plate 150 is made through contact 140 as a buried contact. Capacitor 100 is generally surrounded by an insulating layer 135. The capacitor 100 can be represented by the circuit diagram of FIG. 1B. With proper conductive contact between contact 140 and bottom plate 150, the system capacitance, $C_s$, is generally equal to the capacitance 180 between the bottom plate 150 and the top plate 170 of the capacitor 100.

Figure 1C:
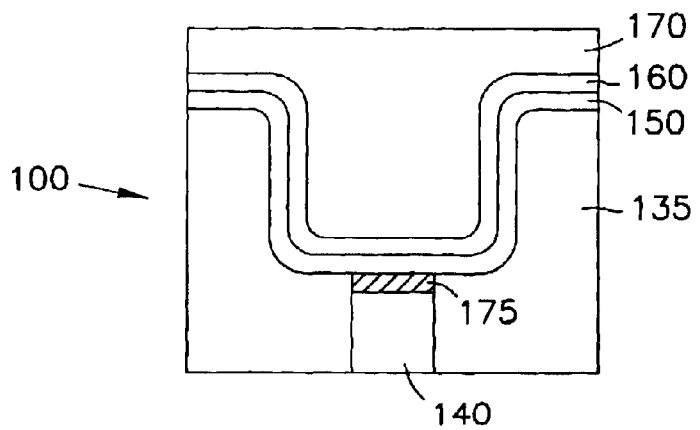
FIG. 1C is a cross-sectional view of the container capacitor of FIG. 1A with interfacial oxide at the bottom plate.
Figure 1D:
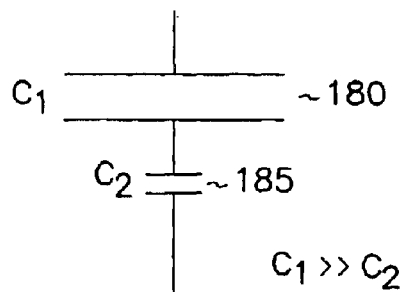
FIG. 1D is a circuit diagram of the container capacitor of FIG. 1C.

FIG. 1C is a cross-sectional view of the container capacitor 100 of FIG. 1A where an interfacial oxide layer 175 exists between the contact 140 and bottom plate 150. In this case, capacitor 100 can be represented by the circuit diagram of FIG. 1D. As shown in FIG. 1D, the system capacitance, $C_s$, includes two components, i.e., a capacitance 180 between the bottom plate 150 and top plate 170, $C_1$, and a capacitance 185 between the contact 140 and the bottom plate 150, $C_2$. The series capacitance of $C_1$ and $C_2$ is governed by the equation, $C_s=(C_1 \times C_2)/(C_1+C_2)$. Because $C_2$ is generally much smaller than $C_1$ due to the relative surface areas and relative dielectric constants, the sum $C_1+C_2$ is approximately equal to $C_1$, allowing the decomposition to the equation $C_s \approx (C_1 \times C_2)/C_1$ or $C_s \approx C_2$. Thus, it can be seen that the formation of an interfacial oxide layer 175 in capacitor 100 can eliminate the capacitance gains provided by the container capacitor structure and the use of high dielectric constant materials in the dielectric layer 160.

Container Structures

The following description will be illustrated in the context of container capacitors, and in particular, container capacitor memory cells for dynamic memory devices. It will be apparent to those skilled in the art that the semiconductor container structures described herein and their methods of fabrication can be adapted to a variety of integrated circuit devices and applications. Accordingly, the semiconductor container structures described herein are not limited to the example embodiments.

Figure 2:
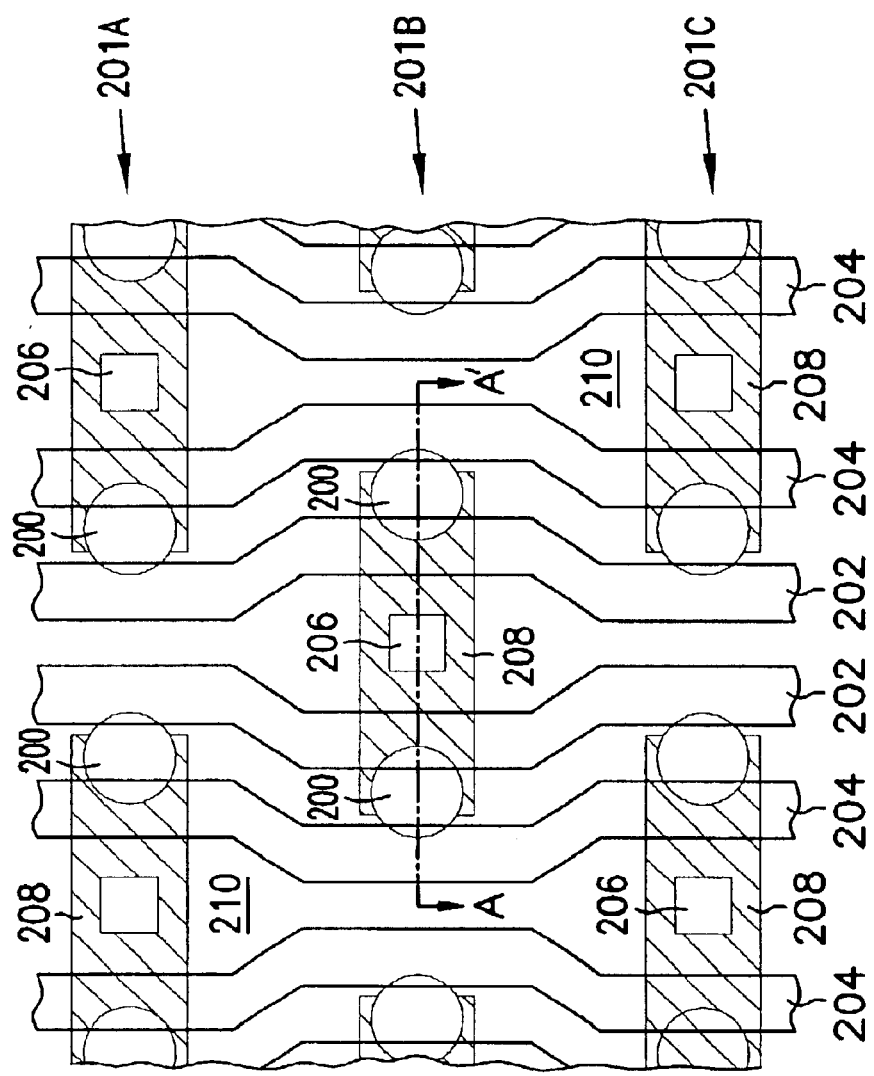
FIG. 2 is an elevation view of a layout of a portion of one embodiment of a memory array of a memory device.

FIG. 2 depicts the general layout of a portion of a memory array of a memory device in accordance with one embodiment of the invention. The memory array includes container capacitor memory cells 200 formed overlying active areas 208. Active areas 208 are separated by field isolation regions 210. Active areas 208 and field isolation regions 210 are formed overlying a semiconductor substrate.

The memory cells 200 are arrayed substantially in rows and columns. Shown in FIG. 2 are portions of three rows 201A, 201B and 201C. Separate digit lines (not shown) would be formed overlying each row 201 and coupled to active areas 208 through digit line contacts 206. Word lines 202 and 204 are further coupled to active areas 208, with word lines 202 coupled to active areas 208 in row 201B and word lines 204 coupled to active areas 208 in rows 201A and 201C. The word lines 202 and 204, coupled to memory cells in this alternating fashion, generally define the columns of the memory array. This folded bit-line architecture is well known in the art for permitting higher densification of memory cells 200.

FIGS. 3A–3L depict one embodiment of a portion of the processing to fabricate the memory device of FIG. 2. FIGS. 3A–3L are cross-sectional views taken along line A–A' of FIG. 2 during various processing stages.

Figure 3A:
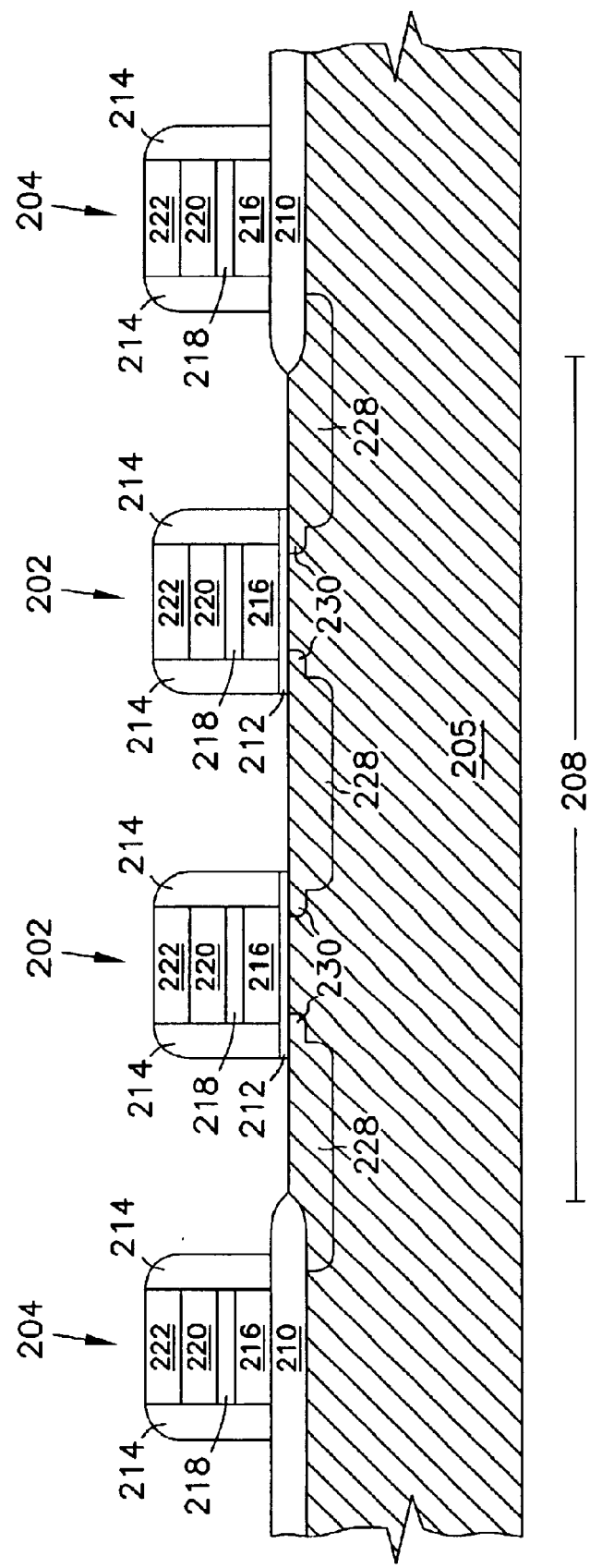

In FIG. 3A, field isolation regions 210 are formed on a substrate 205. Substrate 205 may be a silicon substrate, such as a P-type silicon substrate. Field isolation regions 210 are generally formed of an insulator material, such as silicon oxides, silicon nitrides or silicon oxynitrides. In this embodiment, field isolation regions 210 are formed of silicon dioxide such as by conventional local oxidation of silicon (LOCOS) which creates substantially planar regions of oxide on the substrate surface. Active areas 208 are those areas not covered by the field isolation regions 210 on substrate 205. The creation of the field isolation regions 210 is preceded or followed by the formation of a gate dielectric layer 212. In this embodiment, gate dielectric layer 212 is a thermally grown silicon dioxide, but may be other insulator materials described herein.

Following the creation of the field isolation regions 210 and gate dielectric layer 212, a first conductively doped gate polysilicon layer 216, a gate barrier layer 218, a gate conductor layer 220, a gate cap layer 222 and gate spacers 214 are formed by methods well known in the art. Gate barrier layer 218 may be a metal nitride, such as titanium nitride or tungsten nitride. Gate conductor layer 220 may be any conductive material and is increasingly metal. Gate cap layer 222 is often silicon nitride while gate spacers 214 are generally of an insulator material such as silicon oxide, silicon nitride and silicon oxynitride. The foregoing layers are patterned to form word lines 202 and 204 as gates for field effect transistors (FET). The construction of the word lines 202 and 204 are illustrative only. As a further example, the construction of the word lines 202 and 204 may include a refractory metal silicide layer overlying a polysilicon layer. The refractory metals of chromium (Cr), cobalt (Co), halfnium (Hf), molybdenum (Mo), niobium (Nb), tantalum (Ta), titanium (Ti), tungsten (W), vanadium (V) and zirconium (Zr) are common. Other constructions are well known in the art.

Source/drain regions 228 are formed in the substrate 205 such as by conductive doping of the substrate. Source/drain regions have a conductivity opposite the substrate 205. For a P-type substrate, source/drain regions 228 would have an N-type conductivity. Such conductive doping may be accomplished through ion implantation of phosphorus or arsenic in this embodiment. As is often the case, source/drain regions 228 include lightly-doped regions 230 created by differential levels of ion concentration or even differing dopant ions. Word lines 202 and 204 are adapted to be coupled to periphery contacts (not shown). The periphery contacts are located at the end of the memory array and are adapted for electrical communication with external circuitry.

The formation of the word lines 202 and 204 as described are exemplary of one application to be used in conjunction with various embodiments of the invention. Other methods of fabrication and other applications are also feasible and perhaps equally viable. For clarity and to focus on the formation of the container structures, many of the reference numbers are eliminated from subsequent drawings, e.g., those pertaining to the structure of the word lines and the source/drain regions.

Figure 3B:
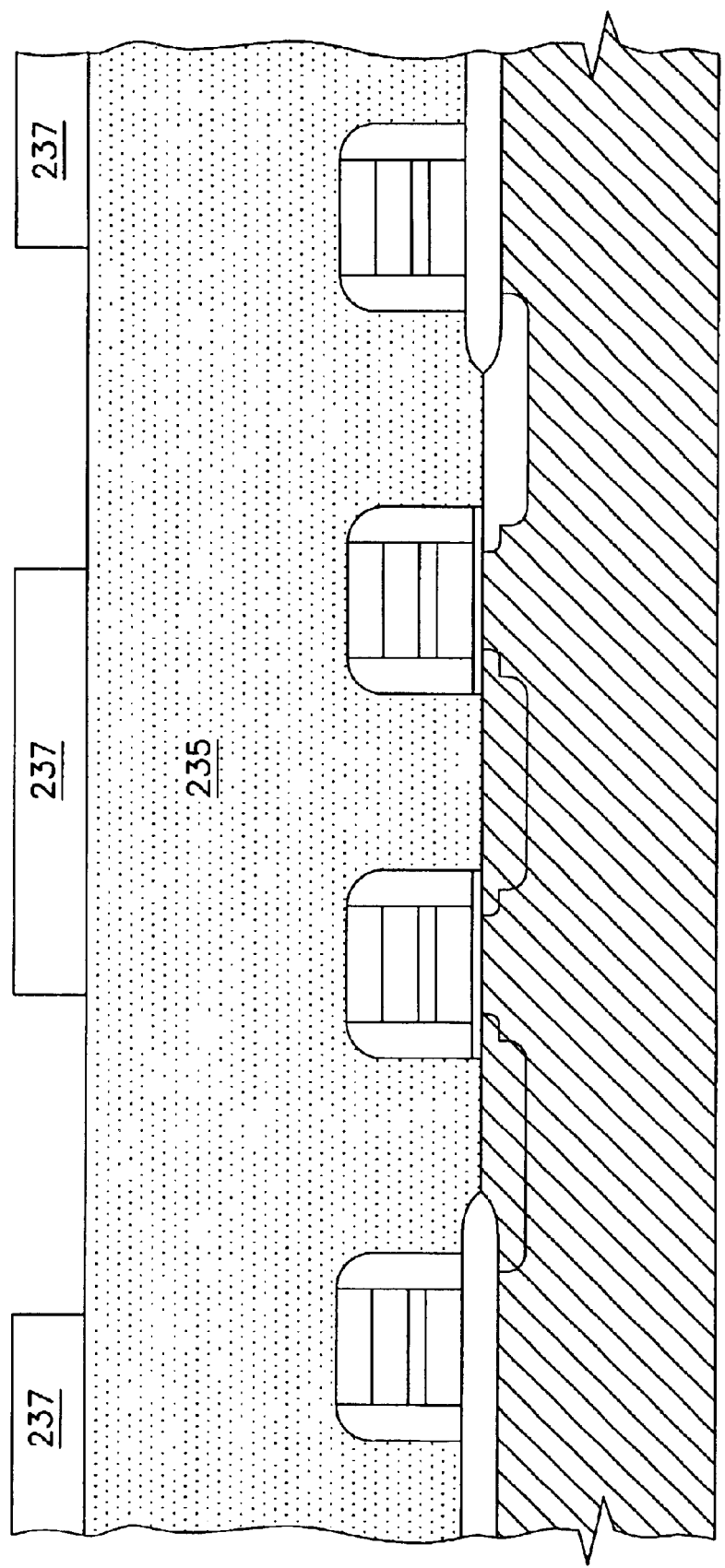

In FIG. 3B, a thick insulating layer 235 is deposited overlying substrate 205, as well as word lines 202 and 204, field isolation regions 210 and active areas 208. Insulating layer 235 is an insulator material such as silicon oxide, silicon nitride and silicon oxynitride materials. In one embodiment, insulating layer 235 is a doped insulator material such as borophosphosilicate glass (BPSG), a boron and phosphorous-doped silicon oxide. The insulating layer 235 is planarized, such as by chemical-mechanical planarization (CMP), in order to provide a uniform height. A mask 237 is formed overlying insulating layer 235 and patterned to define future locations of the memory cells 200.

Figure 3C:
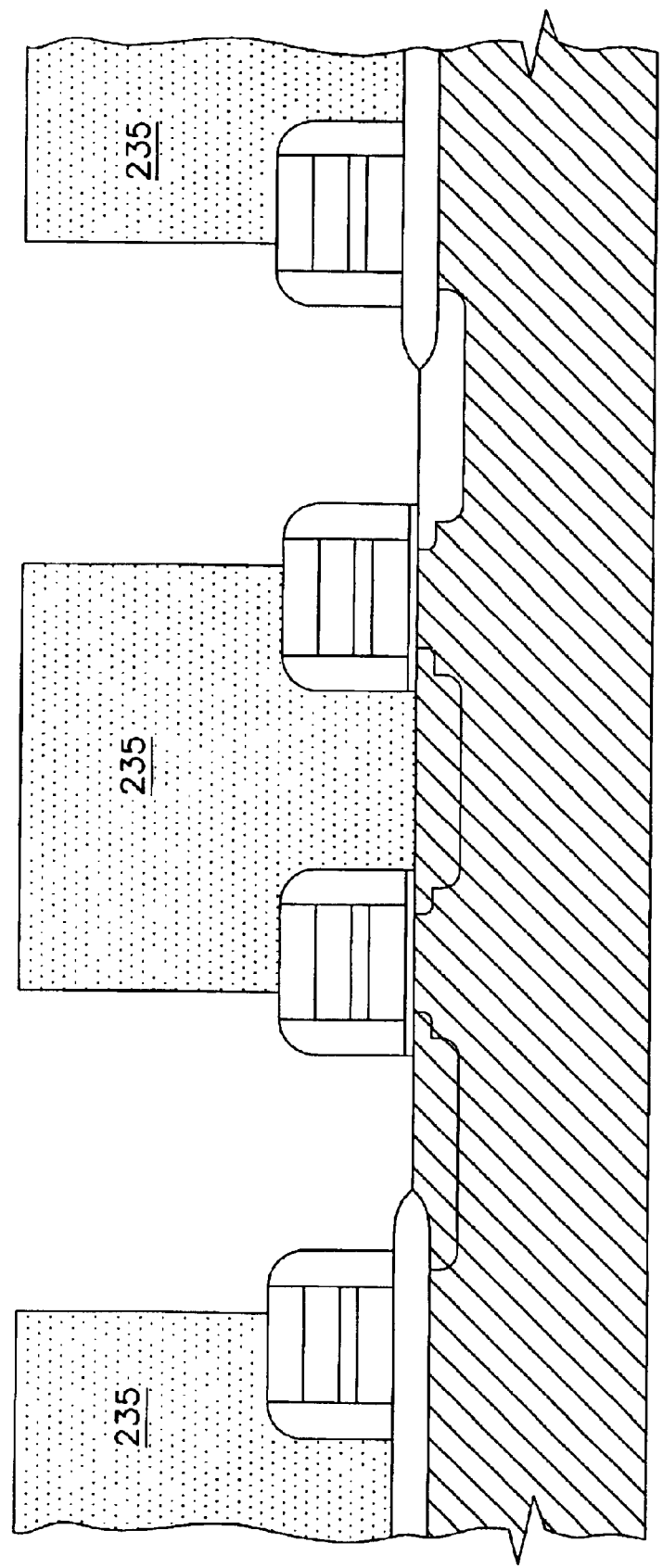

In FIG. 3C, portions of insulating layer 235 exposed by patterned mask 237 are removed and mask 237 is subsequently removed. The portions of insulating layer 235 may be removed by etching or other suitable removal technique known in the art. Removal techniques are generally dependent upon the material of construction of the layer to be removed as well as the surrounding layers to be retained. Patterning of insulating layer 235 creates openings having bottom portions overlying exposed portions of the substrate 205 and sidewalls defined by the insulating layer 235.

Figure 3D:
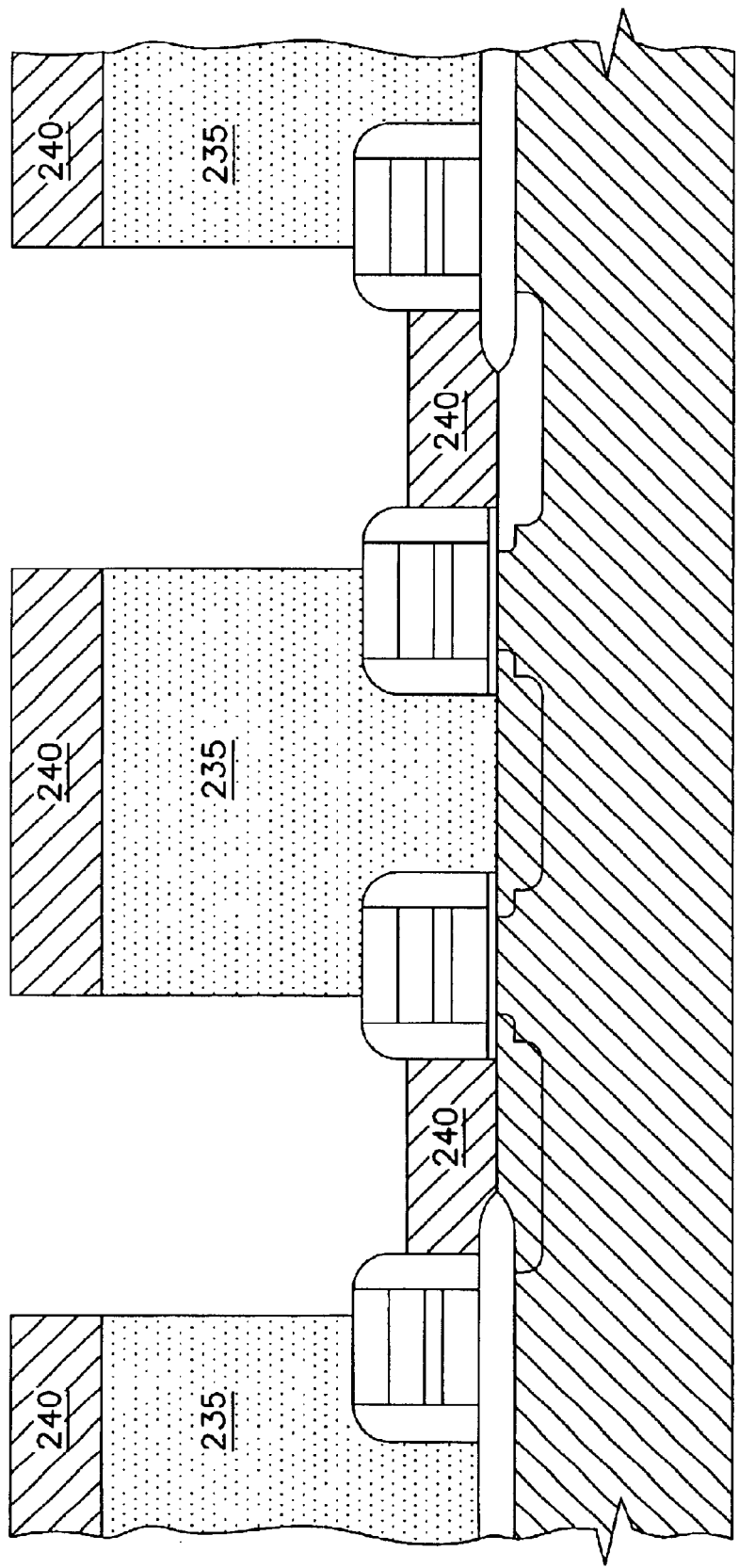

In FIG. 3D, a layer of doped polysilicon is formed overlying exposed portions of active area 208 and top portions of insulating layer 235 to form contact layer 240. Contact layer 240 may be formed by controlled deposition of polysilicon as shown in FIG. 3D. Alternatively, contact layer 240 may be blanket deposited polysilicon followed by an etch-back to leave a layer of polysilicon overlying exposed portions of active area 208 between word lines 202 and 204. In another embodiment, contact layer 240 comprises a reactive conductive material such that it is capable of reacting with the ambients of subsequent processing steps. In a further embodiment, the reactive conductive material of contact layer 240 is reactive to oxygen, i.e., it is oxidizable. In still further embodiments, contact layer 240 is formed from tungsten, titanium nitride, tungsten nitrides, tantalum nitride or aluminum.

Figure 3E:
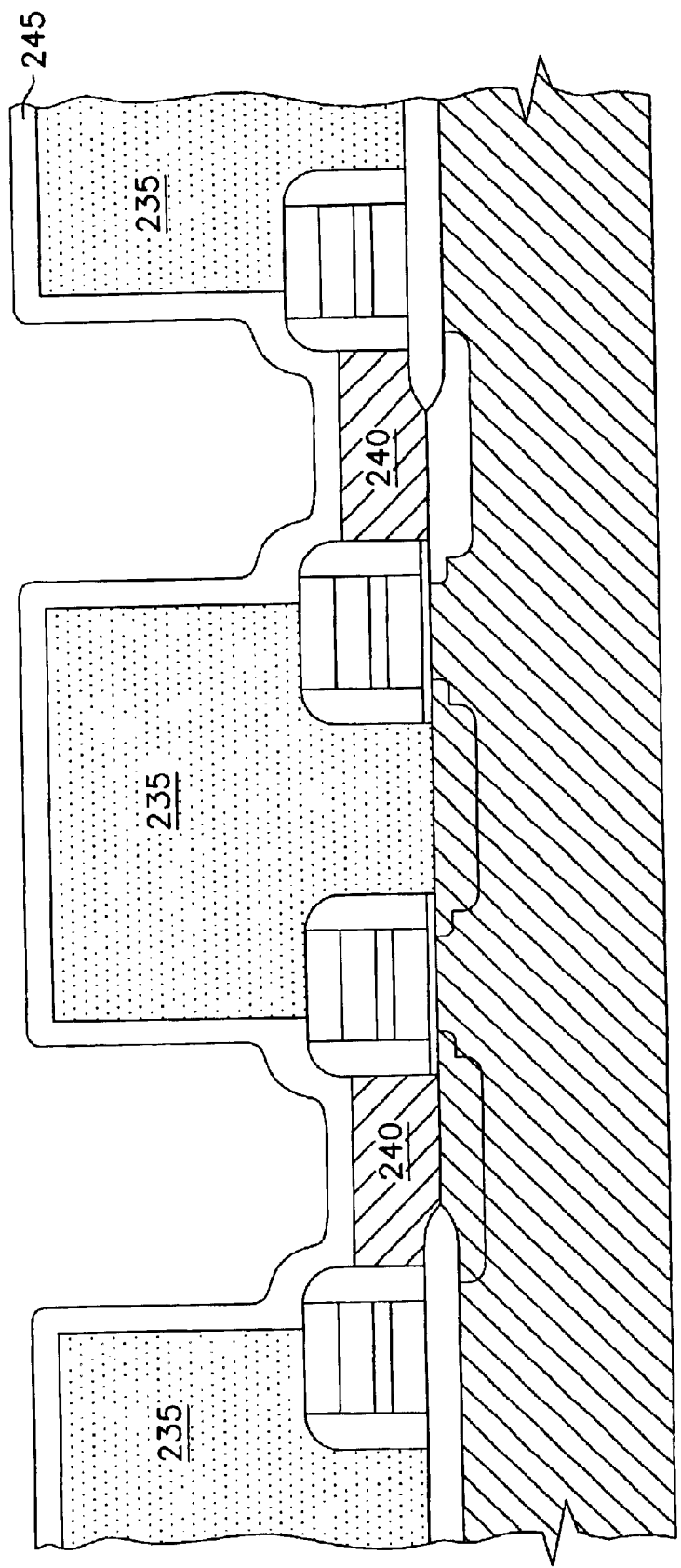

In FIG. 3E, portions of contact layer 240 overlying insulating layer 235 are removed to form contacts 240 between the word lines 202 and 204. A conductive barrier layer 245 is formed overlying the contacts 240 and insulating layer 235. In one embodiment, conductive barrier layer 245 is a conductive barrier material, such as a metal nitride. The metal nitride may be a binary system, such as titanium nitride or tungsten nitride, or a ternary or higher-order system, such as titanium aluminum nitride. The conductive barrier material may act to limit atomic diffusion to the contacts 240, especially atomic diffusion of oxygen. The conductive barrier material may further act to limit atomic diffusion from the contacts 240, e.g., atomic diffusion of silicon from a polysilicon contact to subsequent layers. In addition, the conductive barrier material may act to, improve adhesion of subsequent layers to the contacts 240. In one embodiment, conductive barrier layer 245 is optional.

In a further embodiment, conductive barrier layer 245 is a metal nitride rich in the metal component, i.e., it contains the metal component in concentrations in excess of the stoichiometric amounts required to form the metal nitride. As an example, conductive barrier layer 245 may be a titanium-rich titanium nitride material. Subsequent annealing of the memory device will permit the excess titanium to react with the contact 240. In the case of a polysilicon contact 240, such reaction will produce a titanium suicide interface between contact 240 and conductive barrier layer 245, thus improving the electrical connection between contact 240 and conductive barrier layer 245. As an alternative, such a metal silicide interface can be created by techniques such as implanting metal ions into polysilicon contact 240 to produce a metal-rich region on the upper surface of contact 240. Again, subsequent annealing of the memory device will produce a metal silicide interface between contact 240 and conductive barrier layer 245. In one embodiment, formation of a metal silicide interface includes a refractory metal silicide. In another embodiment, ruthenium is deposited on a polysilicon contact 240 to form a ruthenium layer on the upper surface of contact 240. Subsequent annealing of the memory device in this embodiment will produce a ruthenium silicide ($RuSi_x$) interface at the upper surface of contact 240.

Figure 3F:
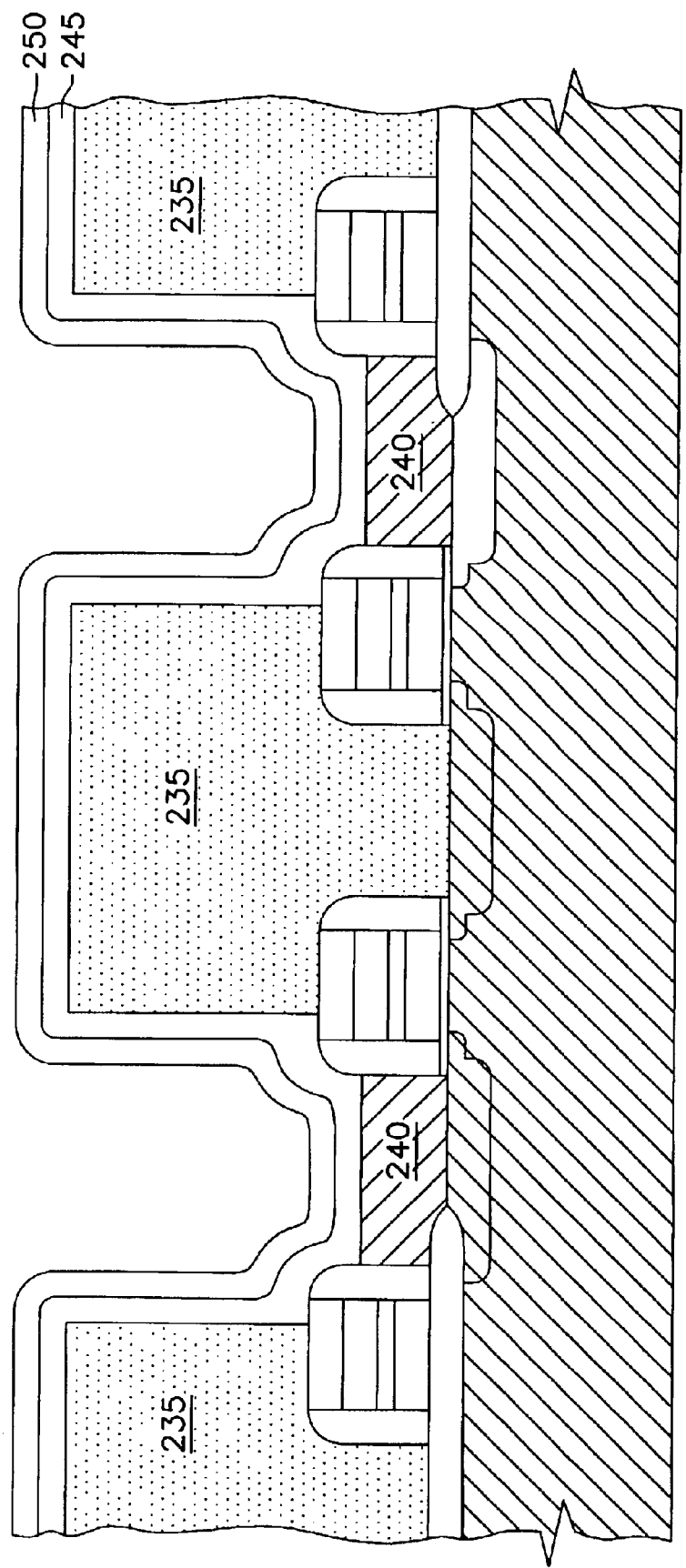

In FIG. 3F, a primary conductive layer 250 is formed overlying the conductive barrier layer 245 or, alternatively, in place of conductive barrier layer 245. Primary conductive layer 250 is any conductive material. In one embodiment, primary conductive layer 250 contains at least one metal layer. In another embodiment, the metal layer is a refractory metal layer. In a further embodiment, primary conductive layer 250 contains a metal of the platinum metals group including iridium (Ir), osmium (Os), palladium (Pd), platinum (Pt), rhodium (Rh) and ruthenium (Ru). In a still further embodiment, primary conductive layer 250 contains a metal of the noble metals group including rhenium (Re), ruthenium, rhodium, palladium, silver (Ag), osmium, iridium, platinum and gold (Au). In yet another embodiment, primary conductive layer 250 is platinum. In one embodiment, primary conductive layer 250 contains a conductive metal oxide. In another embodiment, primary conductive layer 250 contains a metal alloy. In a further embodiment, primary conductive layer 250 is ruthenium oxide ($RuO_x$). In a still further embodiment, primary conductive layer 250 is iridium oxide ($IrO_x$). In yet another embodiment, primary conductive layer 250 is a platinum-rhodium alloy (Pt—Rh).

Primary conductive layer 250 may be formed by any method, such as collimated sputtering, chemical vapor deposition (CVD) or other deposition techniques. Primary conductive layer 250 and conductive barrier layer 245 collectively form the bottom conductive layer or plate of the capacitor. The bottom conductive layer has a closed bottom and sidewalls extending up from the closed bottom. In embodiments where conductive barrier layer 245 is not utilized and primary conductive layer 250 is adjacent contact 240, subsequent annealing of the memory device may produce a reaction between primary conductive layer 250 and contact 240 such than an interface layer is formed. As an example, where primary conductive layer 250 contains a refractory metal and contact 240 contains polysilicon, subsequent annealing will produce a refractory metal suicide interface between primary conductive layer 250 and contact 240. Such metal silicide interface layers are often advantageous in reducing electrical resistance to contact 240.

Figure 3G:
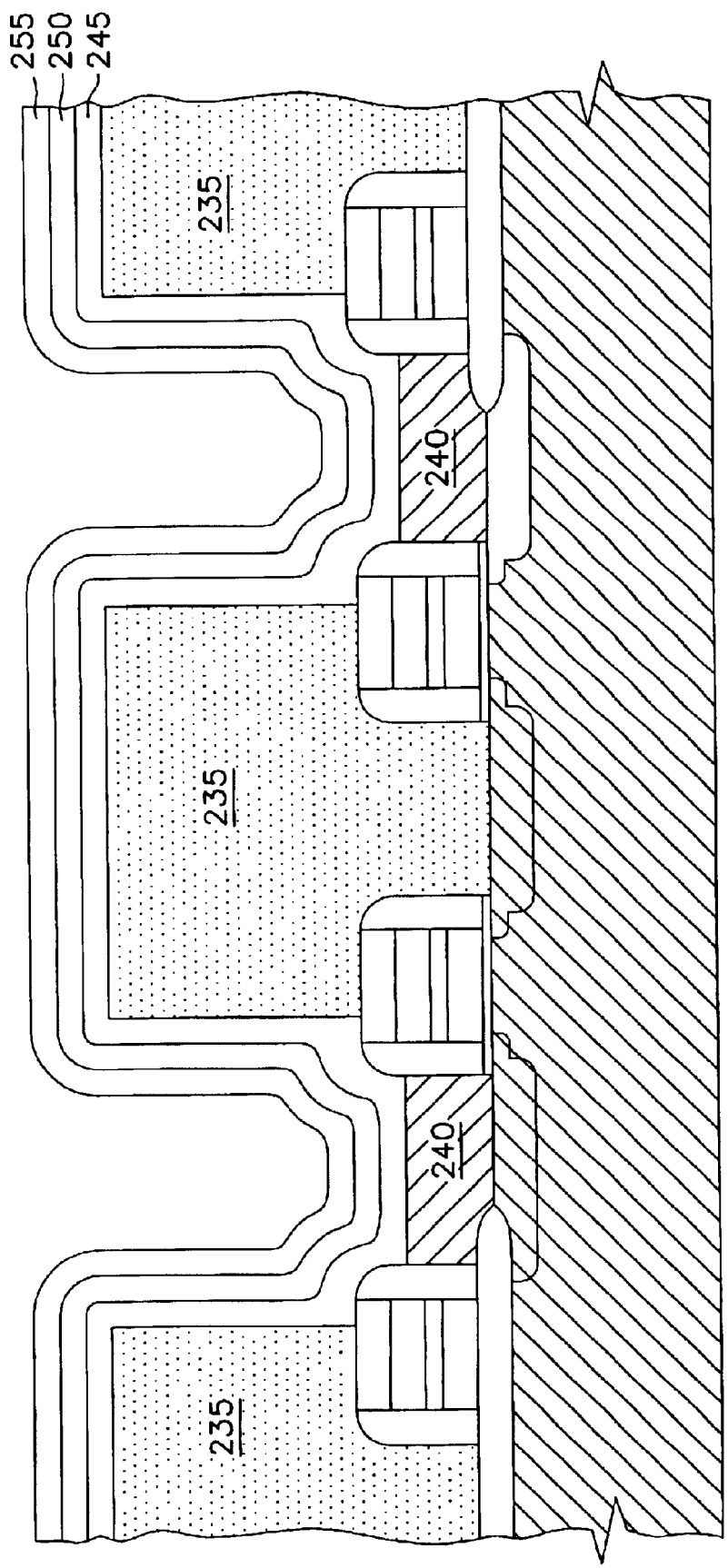

In FIG. 3G, a diffusion barrier layer 255 is formed overlying the bottom conductive layer (including primary conductive layer 250 and conductive barrier layer 245 in this embodiment). Diffusion barrier layer 255 contains a material that inhibits atomic diffusion to at least a portion of primary conductive layer 250 or the bottom conductive layer, such as atomic diffusion of oxygen. Accordingly, diffusion barrier layer 255 inhibits atomic diffusion to the contacts 240. The action of inhibiting atomic diffusion implies a hindrance to the diffusing species, but does not require complete elimination of such atomic diffusion. In one embodiment, diffusion barrier layer 255 comprises silicon. In this embodiment, subsequent conversion of at least a portion of diffusion barrier layer 255 to silicon dioxide, silicon nitride or silicon oxynitride will provide appropriate oxygen-diffusion barrier properties. In another embodiment, diffusion barrier layer 255 comprises silicon dioxide, such as by direct deposition. A portion of the silicon dioxide in this embodiment may subsequently be converted to silicon oxynitride as described below. In a further embodiment, diffusion barrier layer 255 comprises titanium. In this embodiment, subsequent conversion of at least a portion of diffusion barrier layer 255 to titanium nitride will provide appropriate oxygen-diffusion barrier properties. In a still further embodiment, diffusion barrier layer 255 comprises titanium nitride, such as by direct deposition. In yet another embodiment, diffusion barrier layer 255 comprises a refractory metal (with subsequent conversion of at least a portion to the refractory metal nitride) or a refractory metal nitride. Diffusion barrier layer 255 may be deposited as by collimated sputtering, chemical vapor deposition or other deposition technique. Diffusion barrier layer 255 may further be selectively deposited to overlie the upper surface and bottom portion of primary conductive layer 250, leaving sidewall portions of primary conductive layer 250 at least partially exposed. Selective deposition may be attained by such techniques as collimated sputtering with a substantially normal angle of incidence of the sputtered material, as measured in relation to the face plane of the substrate.

Figure 3H:
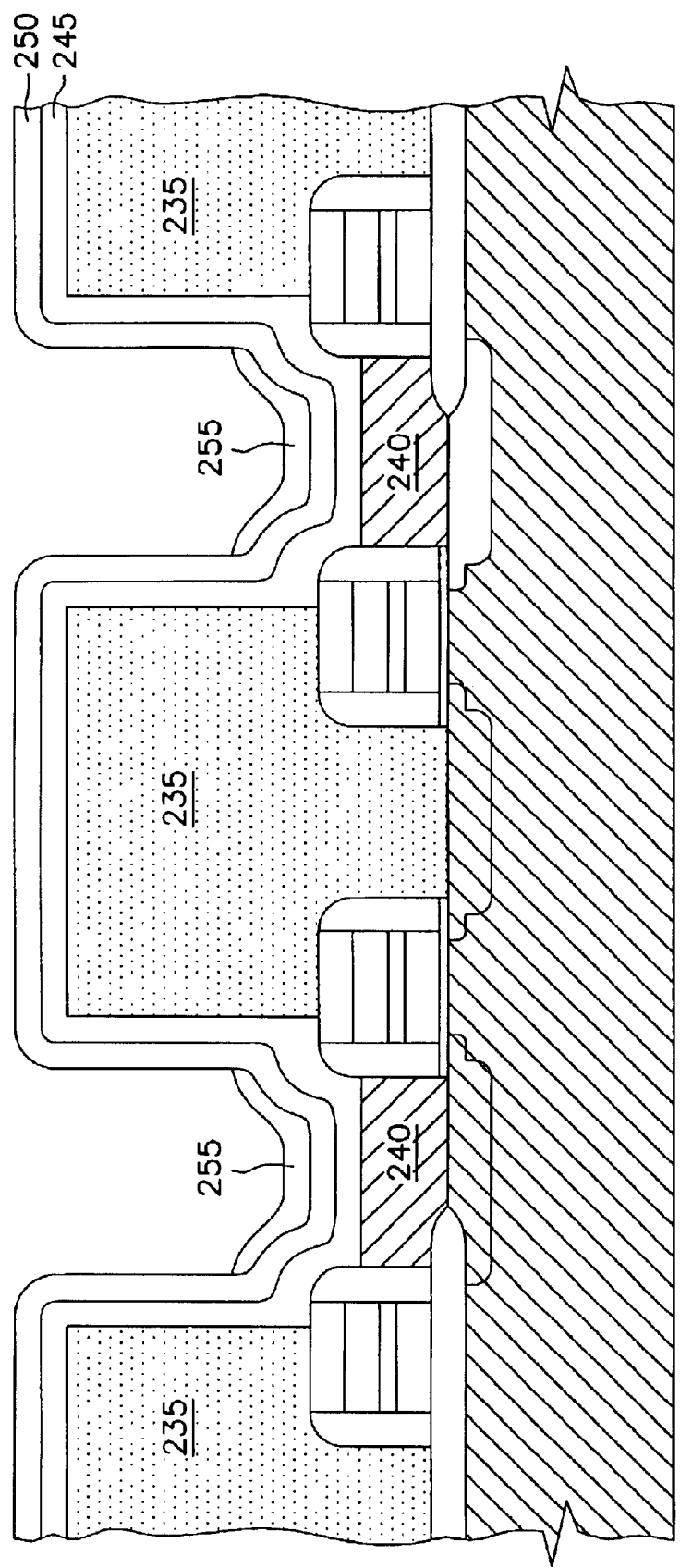
Figure 31:
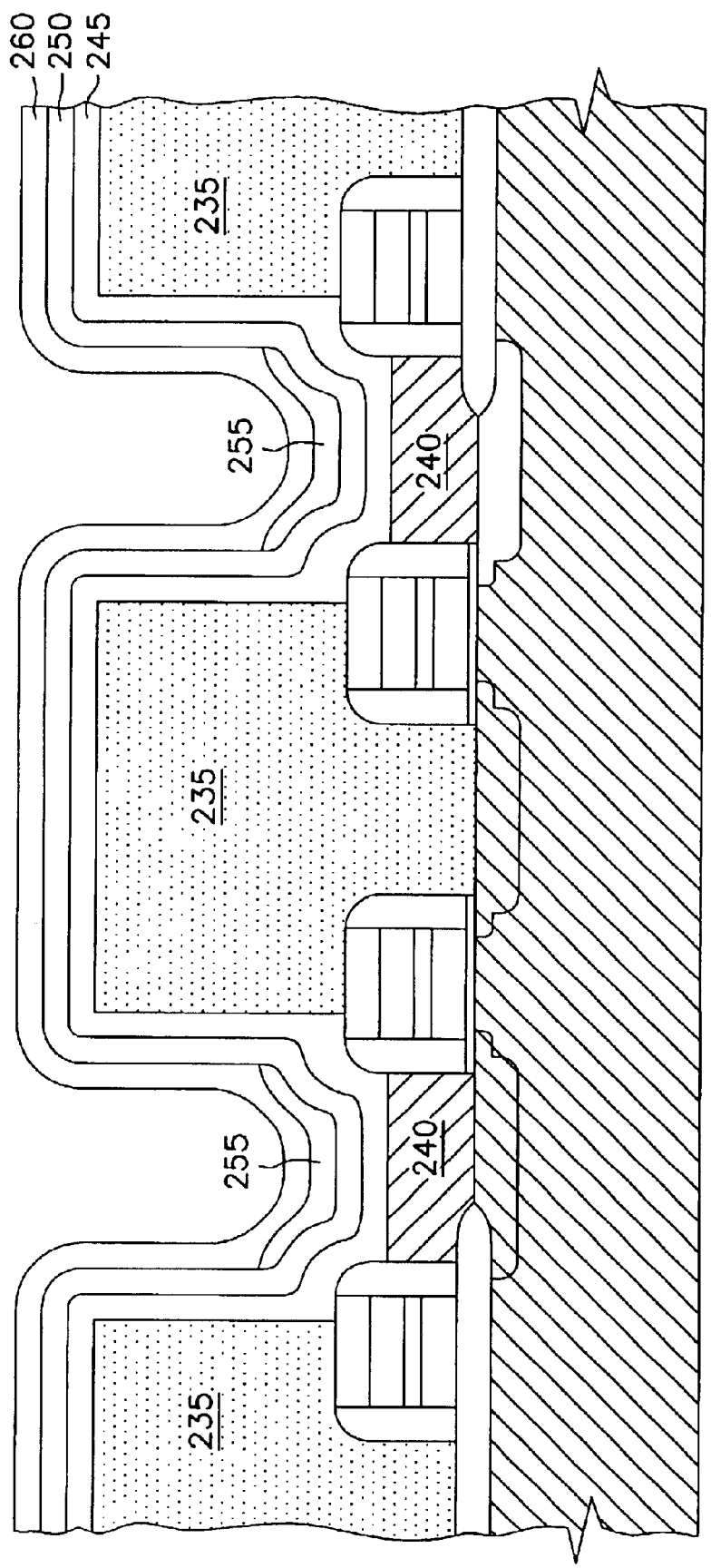

In one embodiment, portions of diffusion barrier layer 255 on the upper surface and sidewall portions of primary conductive layer 250 are removed to expose a portion of primary conductive layer 250, e.g., the sidewall portions, thereby leaving diffusion barrier layer 255 covering a bottom portion of primary conductive layer 250 as shown in FIG. 3H. As one example, portions of diffusion barrier layer 255 may be removed by dipping the memory device in an acid bath. One example of a suitable acid bath may be an aqueous HF solution in the range of approximately 300 parts $H_2O$ to 1 part HF. Another example of a suitable acid bath may be an aqueous HF solution in the range of approximately 100 parts $H_2O$ to 10 parts HF. Acid baths containing HF are particularly suited to removing layers containing silicon dioxide or silicon nitride. A further example of a suitable acid bath may be an aqueous $HNO_3$ solution. Acid baths containing $HNO_3$ are particularly suited to removing layers containing silicon. A still further example of suitable acid baths may be aqueous $H_2SO_4$ and HCl solutions. Acid baths containing $H_2SO_4$ and HCl are particularly suited to removing layers containing titanium. Acid baths or solvents may be tailored to the particular materials of construction utilized in order to achieve such selective removal described herein.

As another example, portions of diffusion barrier layer 255 may be removed by a selective etch process, such as a reactive ion etch (RIE) process using an angled ion trajectory. In the embodiment where diffusion barrier layer 255 is selectively deposited to overlie the upper surface and bottom portions of primary conductive layer 250, chemical-mechanical planarization (CMP) may be used to remove portions of diffusion barrier layer 255 on the upper surface to produce a diffusion barrier layer 255 substantially as shown in FIG. 3H. In another embodiment, diffusion barrier layer 255 is maintained on the upper surface and sidewalls of primary conductive layer 250. In a further embodiment, diffusion barrier layer 255 is annealed in a nitrogen-containing ambient, such as ammonia, to convert at least a portion of diffusion barrier layer 255 to a silicon nitride (where diffusion barrier layer 255 contains silicon), silicon oxynitride (where diffusion barrier layer 255 contains silicon oxide) or refractory metal nitride (where diffusion barrier layer 255 contains a refractory metal, e.g., titanium). In FIG. 3I, a dielectric layer 260 is formed overlying diffusion barrier layer 255 and primary conductive layer 250. As shown in FIG. 3I, dielectric layer 260 is adjacent sidewall portions of primary conductive layer 250 or the remaining portion of primary conductive layer 250 exposed by diffusion barrier layer 255. Dielectric layer 260 is further adjacent diffusion barrier layer 255 overlying the bottom portion of primary conductive layer 250. Dielectric layer 260 may be adjacent only diffusion barrier layer 255 in embodiments where diffusion barrier layer 255 covers the bottom portion and sidewall portions of primary conductive layer 250, i.e., where no portion of primary conductive layer 250 is exposed by diffusion barrier layer 255.

In one embodiment, dielectric layer 260 contains a dielectric material having a high dielectric constant. In another embodiment, dielectric layer 260 contains a dielectric material having a dielectric constant greater than approximately 7. In a further embodiment, dielectric layer 260 contains a dielectric material having a dielectric constant greater than approximately 50. In a still further embodiment, dielectric layer 260 contains at least one metal oxide dielectric material. In yet another embodiment, dielectric layer 260 contains at least one dielectric material such as $Ba_xSr_{(1-x)}TiO_3$ [BST; where 0<x<1], $BaTiO_3$, $SrTiO_3$, $PbTiO_3$, $Pb(Zr,Ti)O_3$ [PZT], $(Pb,La)(Zr,Ti)O_3$ [PLZT], $(Pb,La)TiO_3$ [PLT], $Ta_2O_5$, $KNO_3$, and $LiNbO_3$. These metal oxides have dielectric constant values generally above 50 and will likely replace the standard $Si_3N_4$, $SiO_2/Si_3N_4$, $Si_3N_4/SiO_2$, or $SiO_2/Si_3N_4/SiO_2$ composite films often used in 256 kilobits (Kb) to 64 megabits (Mb) generations of DRAMs. Comparatively, $Si_3N_4$ and $SiO_2/Si_3N_4$ composite films generally have dielectric constant values of about 7 or less. In a further embodiment, dielectric layer 260 contains BST (barium strontium titanate). The BST may be deposited at a thickness within the range of approximately 30 nm–300 nm by RF-magnetron sputtering, chemical vapor deposition (CVD) or other suitable deposition technique. Dielectric layer 260 may be annealed in an oxygen-containing ambient, such as an ambient containing diatomic oxygen and/or ozone, at a temperature within the range of approximately 200 to 800° C. The actual oxygen-containing ambient, oxygen concentration and temperature may vary for the specific dielectric deposited. These variations are well known to those skilled in the art. Annealing of the dielectric layer 260 in an oxygen-containing ambient may convert at least a portion of diffusion barrier layer 255 to silicon dioxide (where diffusion barrier layer 255 contains silicon), silicon oxynitride (where diffusion barrier layer 255 contains silicon nitride) or refractory metal oxide (where diffusion barrier layer 255 contains a refractory metal).

The contacts 240 are generally not oxidized during the application of a high-temperature anneal due to the fact that they are protected from the oxygen-containing ambient and atomic diffusion of oxygen by diffusion barrier layer 255 and optional conductive barrier layer 245. By protection from oxidation, contacts 240 are less likely to form interfacial oxide. Therefore, capacitance is effectively increased over methods where portions of contacts 240 are oxidized.

Diffusion barrier layer 255 produces a capacitance in parallel with the capacitance produced by dielectric layer 260. Accordingly, the capacitance produced by diffusion barrier layer 255 is additive to the capacitance produced by dielectric layer 260. Diffusion barrier layer 255 thus inhibits formation of interfacial oxide, without producing the detrimental capacitance effects as described with reference to FIGS. 1C–1D.

Figure 3J:
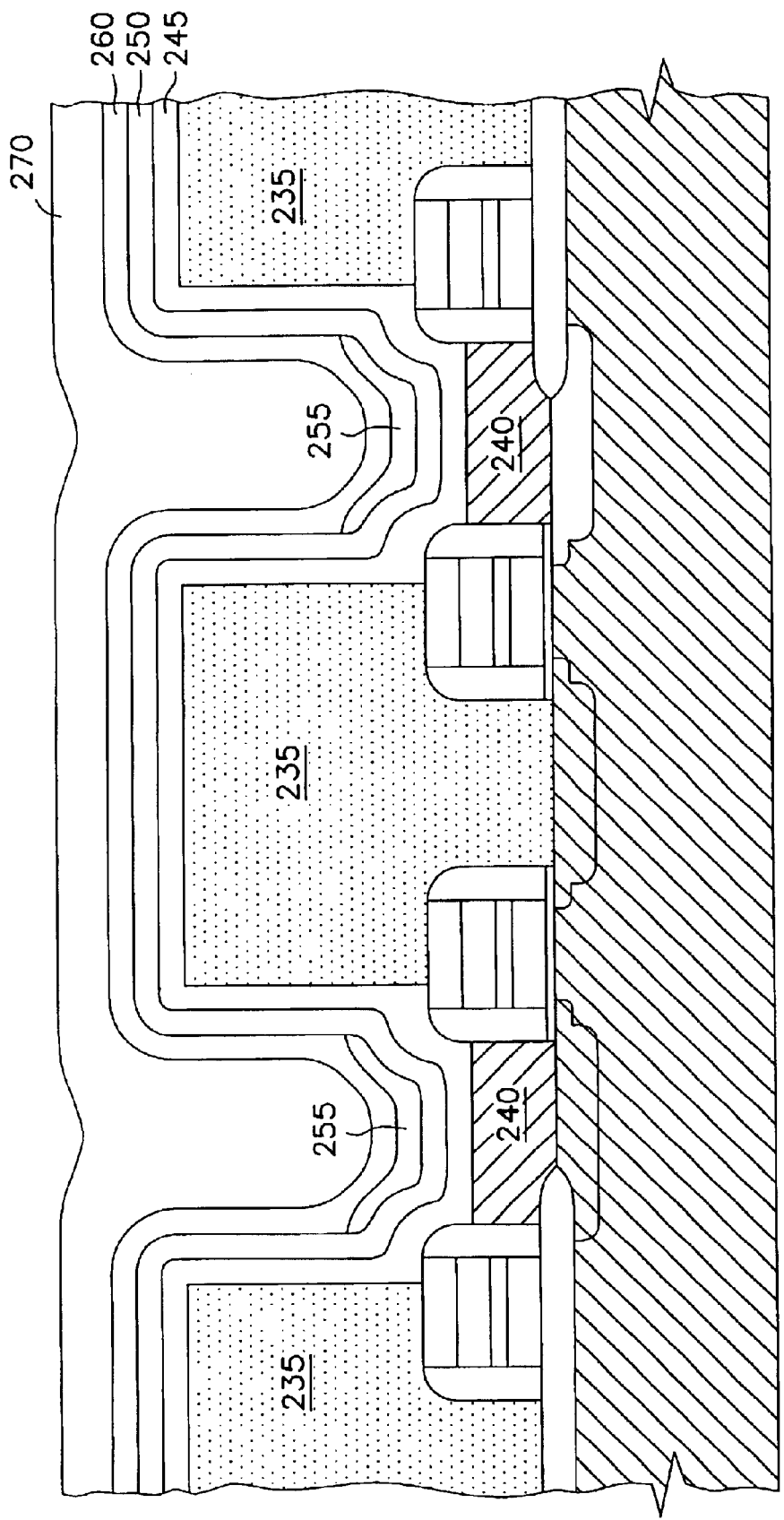
Figure 3K:
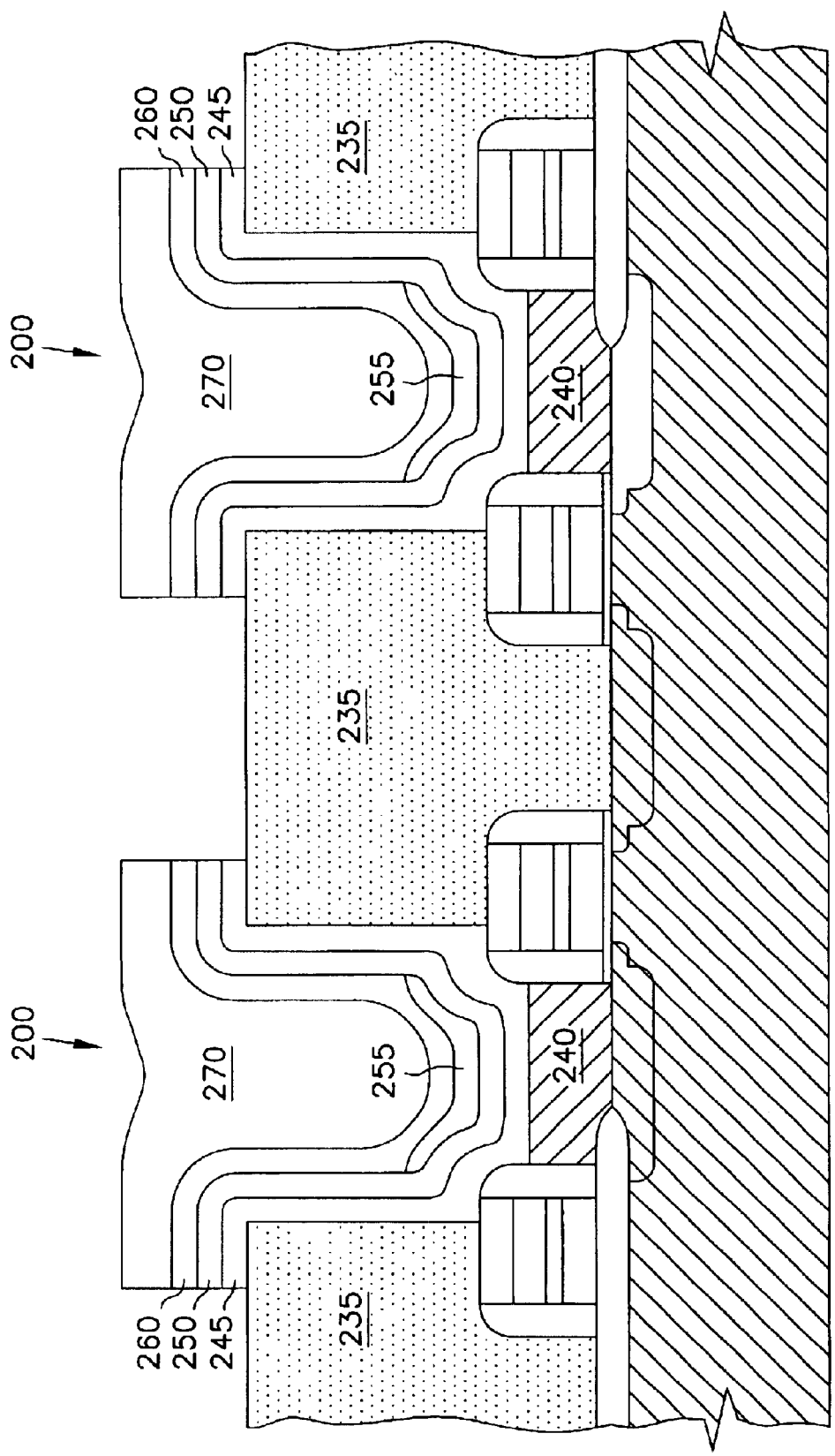
Figure 3L:
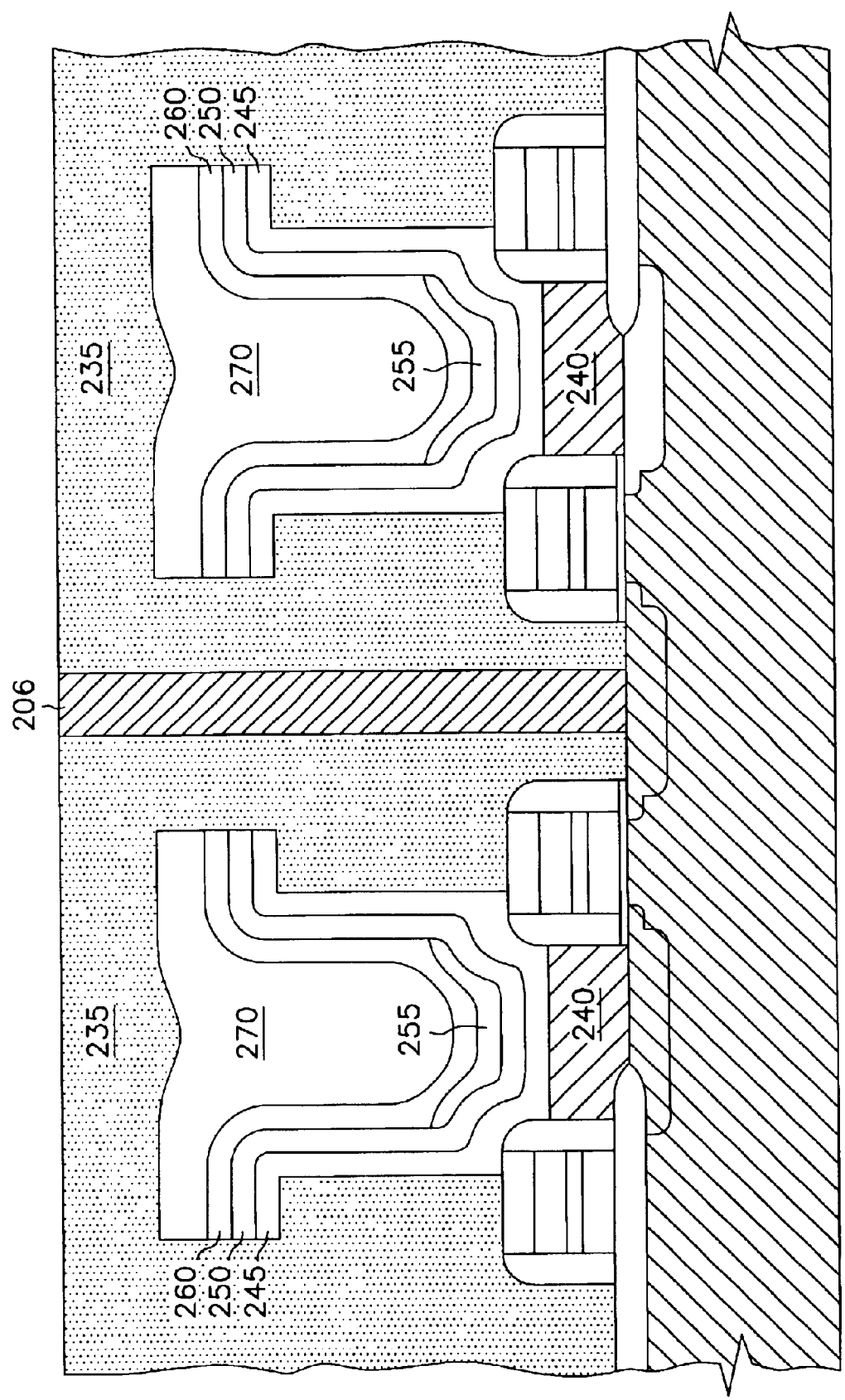

In FIG. 3J, a conductive layer 270 is deposited to form the top conductive layer or plate of the capacitor. Top conductive layer 270 may be of any conductive material. In one embodiment, top conductive layer 270 is a doped polysilicon layer. In another embodiment, top conductive layer 270 is a conductive metal oxide layer. In a further embodiment, top conductive layer 270 is ruthenium oxide. In a still further embodiment, top conductive layer 270 is iridium oxide. Layers 245 through 270 are then patterned by techniques known in the art to define memory cells 200 in FIG. 3K. Insulating layer 235 is extended in FIG. 3L, such as by further deposition of insulator material, and followed by formation of digit line contact 206 for connection to the digit line (not shown). Access to each memory cell 200 is controlled by activating its associated word line 202 and sensing the charge stored on the memory cell 200 through digit line contact 206 as is well understood in the art.

Figure 4A:
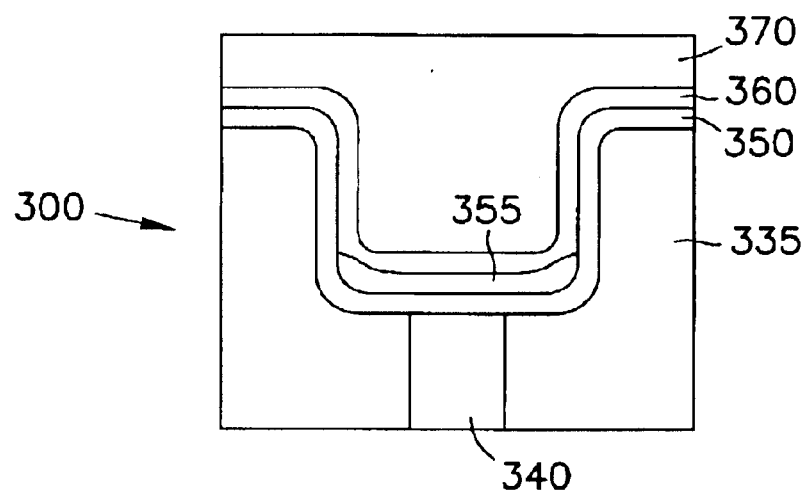
FIG. 4A is a cross-sectional view of a container capacitor.
Figure 4B:
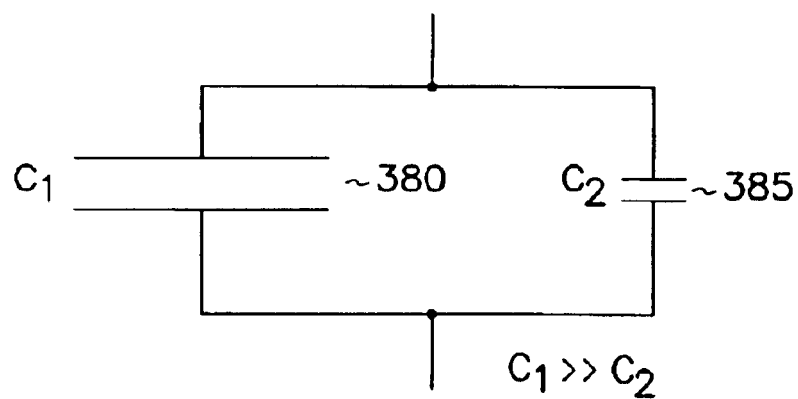
FIG. 4B is a circuit diagram of the container capacitor of FIG. 4A.

Using a diffusion barrier layer as described herein, capacitors thus formed are less prone to interfacial oxide between the bottom plate and the contact. The capacitance change introduced by the diffusion barrier layer is not in series like the interfacial oxide, but is in a parallel relationship. FIG. 4A is a cross-sectional view of a container capacitor 300 utilizing a diffusion barrier layer. Container capacitor 300 includes a conductive bottom plate 350, a diffusion barrier layer 355, a dielectric layer 360 and a conductive top plate 370. Electrical contact to bottom plate 350 is made through contact 340 as a buried contact. Capacitor 300 is generally surrounded by an insulating layer 335. The capacitor 300 can be represented by the circuit diagram of FIG. 4B. With proper conductive contact between contact 340 and bottom plate 350, the system capacitance, $C_S$, includes two components, i.e., a capacitance 380 between the sidewalls of the bottom plate 350 and top plate 370, $C_1$, and a capacitance 385 between the bottom of bottom plate 350 and top plate 370, $C_2$. The parallel capacitance of $C_1$ and $C_2$ is governed by the equation, $C_s = C_1 + C_2$. Because $C_2$ is generally much smaller than $C_1$ due to the relative surface areas and relative dielectric constants of dielectric layer 360 and diffusion barrier layer 355, the sum $C_1 + C_2$ is approximately equal to $C_1$, allowing the decomposition to the equation $C_s \approx C_1$. Thus, it can be seen that the formation of a diffusion barrier layer permits protection from the formation of interfacial oxide without substantially affecting the system capacitance.

Memory Devices

Figure 5:
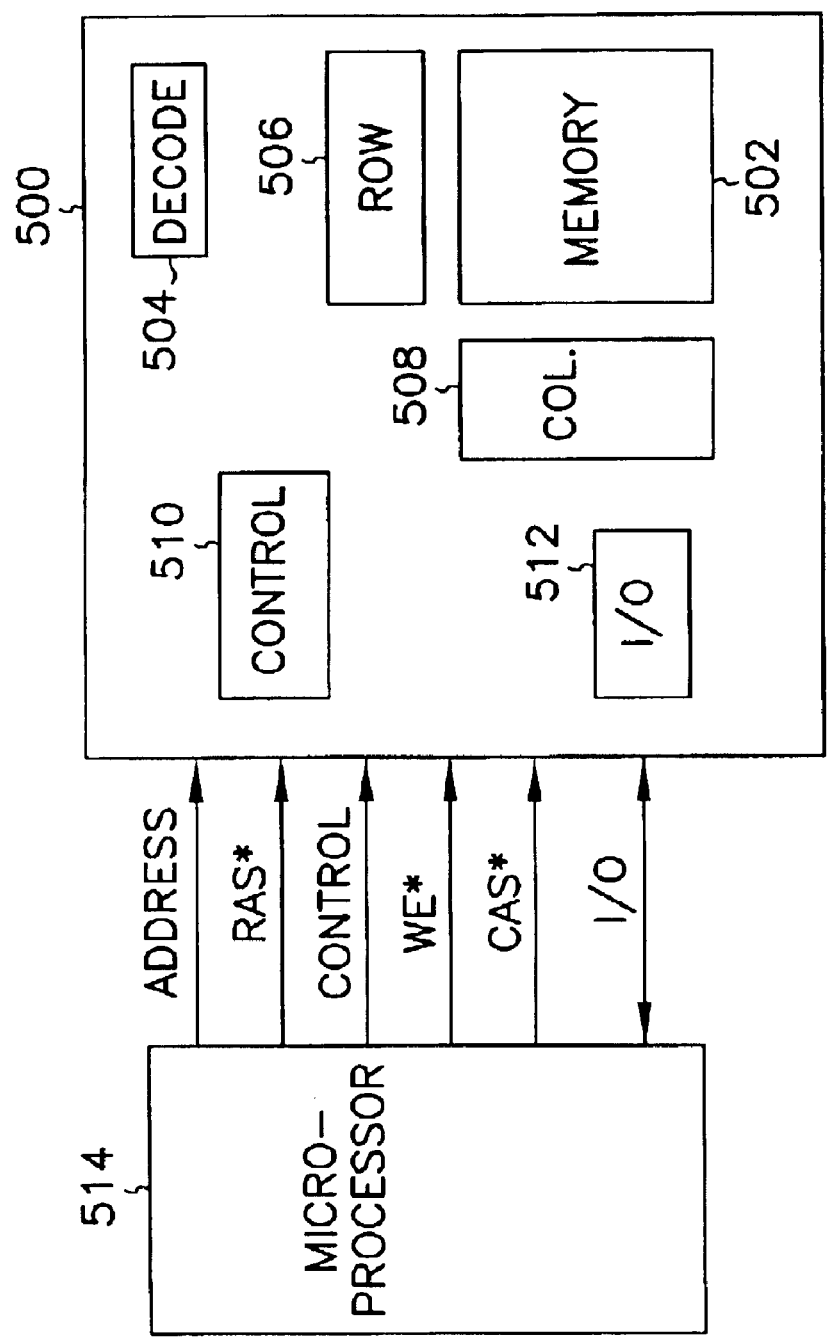
FIG. 5 is a block diagram of one embodiment of an integrated circuit memory device.

FIG. 5 is a simplified block diagram of a memory device according to one embodiment of the invention. The memory device 500 includes an array of memory cells 502, address decoder 504, row access circuitry 506, column access circuitry 508, control circuitry 510, and Input/Output circuit 512. The memory can be coupled to an external microprocessor 514, or memory controller for memory accessing. The memory receives control signals from the processor 514, such as WE*, RAS* and CAS* signals. The memory is used to store data which is accessed via I/O lines. It will be appreciated by those skilled in the art that additional circuitry and control signals can be provided, and that the memory device of FIG. 5 has been simplified to help focus on the invention. At least one of the memory cells has a container capacitor in accordance with the invention.

It will be understood that the above description of a DRAM (Dynamic Random Access Memory) is intended to provide a general understanding of the memory and is not a complete description of all the elements and features of a DRAM. Further, the invention is equally applicable to any size and type of memory circuit and is not intended to be limited to the DRAM described above. Other alternative types of devices include SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs and other emerging DRAM technologies.

As recognized by those skilled in the art, memory devices of the type described herein are generally fabricated as an integrated circuit containing a variety of semiconductor devices. The integrated circuit is supported by a substrate. Integrated circuits are typically repeated multiple times on each substrate. The substrate is further processed to separate the integrated circuits into dies as is well known in the art.

Semiconductor Dies

Figure 6:
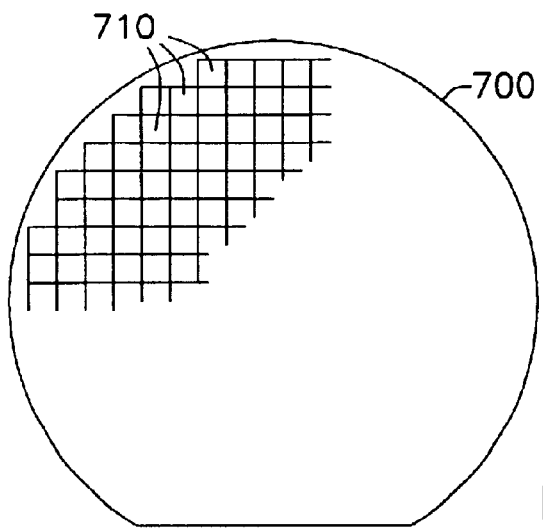
FIG. 6 is an elevation view of one embodiment of a wafer containing semiconductor dies.

With reference to FIG. 6, in one embodiment, a semiconductor die 710 is produced from a wafer 700. A die is an individual pattern, typically rectangular, on a substrate that contains circuitry, or integrated circuit devices, to perform a specific function. At least one of the integrated circuit devices is a container structure or container capacitor in accordance with the invention. A semiconductor wafer will typically contain a repeated pattern of such dies containing the same functionality. Die 710 may contain circuitry for the inventive memory device, as discussed above. Die 710 may further contain additional circuitry to extend to such complex devices as a monolithic processor with multiple functionality. Die 710 is typically packaged in a protective casing (not shown) with leads extending therefrom (not shown) providing access to the circuitry of the die for unilateral or bilateral communication and control.

Circuit Modules

Figure 7:
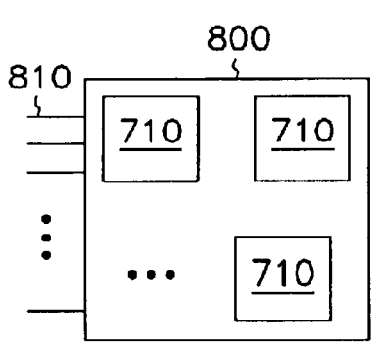
FIG. 7 is a block diagram of one embodiment of an exemplary circuit module.

As shown in FIG. 7, two or more dies 710 may be combined, with or without protective casing, into a circuit module 800 to enhance or extend the functionality of an individual die 710. Circuit module 800 may be a combination of dies 710 representing a variety of functions, or a combination of dies 710 containing the same functionality. One or more dies 710 of circuit module 800 contain at least one container structure or container capacitor in accordance with the invention.

Some examples of a circuit module include memory modules, device drivers, power modules, communication modems, processor modules and application-specific modules, and may include multilayer, multichip modules. Circuit module 800 may be a subcomponent of a variety of electronic systems, such as a clock, a television, a cell phone, a personal computer, an automobile, an industrial control system, an aircraft and others. Circuit module 800 will have a variety of leads 810 extending therefrom and coupled to the dies 710 providing unilateral or bilateral communication and control.

Figure 8:
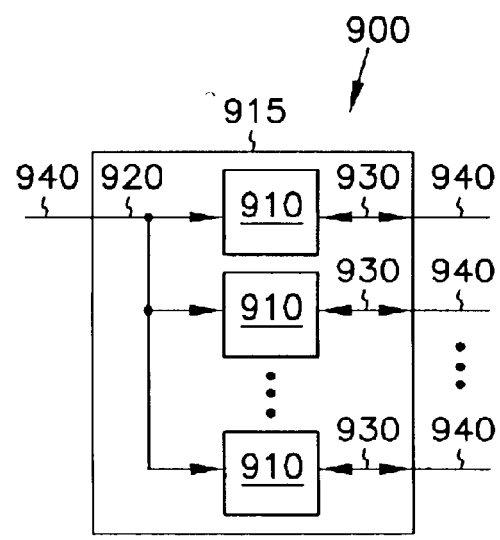
FIG. 8 is a block diagram of one embodiment of an exemplary memory module.

FIG. 8 shows one embodiment of a circuit module as memory module 900. Memory module 900 contains multiple memory devices 910 contained on support 915, the number depending upon the desired bus width and the desire for parity. Memory module 900 accepts a command signal from an external controller (not shown) on a command link 920 and provides for data input and data output on data links 930. The command link 920 and data links 930 are connected to leads 940 extending from the support 915. Leads 940 are shown for conceptual purposes and are not limited to the positions shown in FIG. 8.

Electronic Systems

Figure 9:
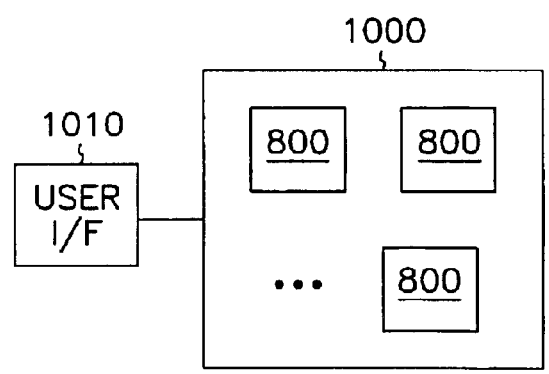
FIG. 9 is a block diagram of one embodiment of an exemplary electronic system.

FIG. 9 shows an electronic system 1000 containing one or more circuit modules 800. Electronic system 1000 generally contains a user interface 1010. User interface 1010 provides a user of the electronic system 1000 with some form of control or observation of the results of the electronic system 1000. Some examples of user interface 1010 include the keyboard, pointing device, monitor or printer of a personal computer; the tuning dial, display or speakers of a radio; the ignition switch, gauges or gas pedal of an automobile; and the card reader, keypad, display or currency dispenser of an automated teller machine. User interface 1010 may further describe access ports provided to electronic system 1000. Access ports are used to connect an electronic system to the more tangible user interface components previously exemplified. One or more of the circuit modules 800 may be a processor providing some form of manipulation, control or direction of inputs from or outputs to user interface 1010, or of other information either preprogrammed into, or otherwise provided to, electronic system 1000. As will be apparent from the lists of examples previously given, electronic system 1000 will often contain certain mechanical components (not shown) in addition to circuit modules 800 and user interface 1010. It will be appreciated that the one or more circuit modules 800 in electronic system 1000 can be replaced by a single integrated circuit. Furthermore, electronic system 1000 may be a subcomponent of a larger electronic system.

Figure 10:
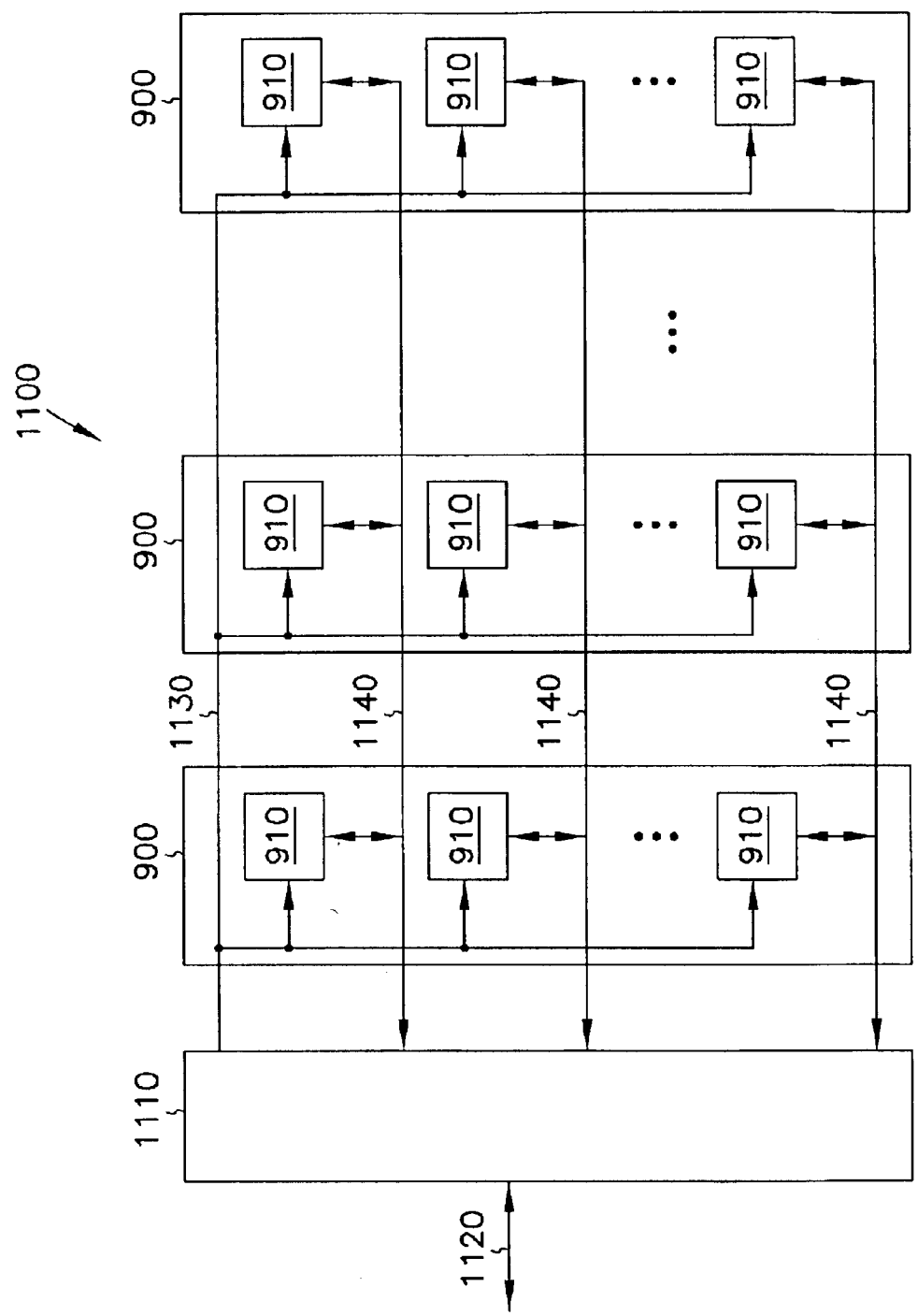
FIG. 10 is a block diagram of one embodiment of an exemplary memory system.

FIG. 10 shows one embodiment of an electronic system as memory system 1100. Memory system 1100 contains one or more memory modules 900 and a memory controller 1110. Memory controller 1110 provides and controls a bidirectional interface between memory system 1100 and an external system bus 1120. Memory system 1100 accepts a command signal from the external bus 1120 and relays it to the one or more memory modules 900 on a command link 1130. Memory system 1100 provides for data input and data output between the one or more memory modules 900 and external system bus 1120 on data links 1140.

Figure 11:
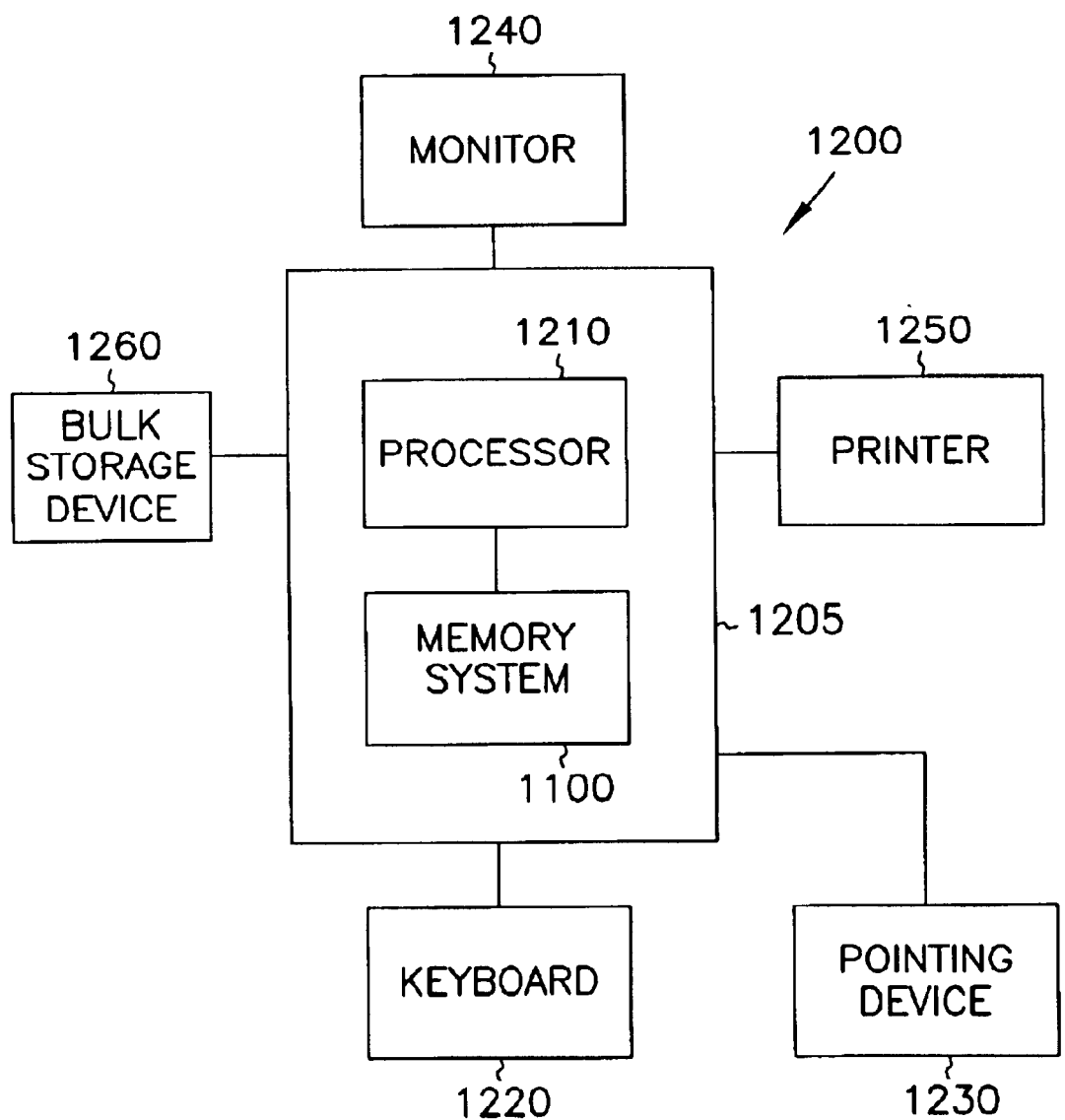
FIG. 11 is a block diagram of one embodiment of an exemplary computer system.

FIG. 11 shows a further embodiment of an electronic system as a computer system 1200. Computer system 1200 contains a processor 1210 and a memory system 1100 housed in a computer unit 1205. Computer system 1200 is but one example of an electronic system containing another electronic system, i.e., memory system 1100, as a subcomponent. Computer system 1200 optionally contains user interface components. Depicted in FIG. 11 are a keyboard 1220, a pointing device 1230, a monitor 1240, a printer 1250 and a bulk storage device 1260. It will be appreciated that other components are often associated with computer system 1200 such as modems, device driver cards, additional storage devices, etc. It will further be appreciated that the processor 1210 and memory system 1100 of computer system 1200 can be incorporated on a single integrated circuit. Such single package processing units reduce the communication time between the processor and the memory circuit.

Conclusion

Container capacitors may be subjected to oxidizing ambients, especially in the case of high dielectric constant oxide-containing materials. The oxidizing ambients may diffuse oxygen through the bottom plate of the capacitor to its electrical contact. Where the contact to the bottom plate is oxidizable, as in the case of polysilicon plug contacts, the atomic diffusion of oxygen may form interfacial oxide between the contact and the bottom plate. This interfacial oxide can control the overall or system capacitance of the capacitor structure. The various embodiments of the invention provide structures and methods to inhibit atomic diffusion of oxygen and decrease the risk of interfacial oxide formation.

While the invention has been described and illustrated with respect to forming container capacitors for a memory cell, it should be apparent that the same processing techniques can be used to form other container capacitors for other applications as well as other container-shaped semiconductor structures. As one example, capacitors formed in accordance with the methods described herein may be used as on-chip capacitors utilized to reduce lead impedance of a packaged integrated circuit chip. Furthermore, while the various embodiments of the invention have been discussed particularly in association with the inhibition of atomic diffusion of oxygen, methods and structures described herein can be utilized to inhibit the atomic diffusion of other chemical species through an appropriate choice of materials for the diffusion barrier layer.

Although specific embodiments have been illustrated and described herein, it will be appreciated by those of ordinary skill in the art that any arrangement which is calculated to achieve the same purpose may be substituted for the specific embodiments shown. Many adaptations of the invention will be apparent to those of ordinary skill in the art. For example, other materials and shapes, as well as other deposition and removal processes, may be utilized in conjunction with the invention. Accordingly, this application is intended to cover any adaptations or variations of the invention. It is manifestly intended that this invention be limited only by the following claims and equivalents thereof.

What is claimed is:

1. A method of forming a semiconductor structure, comprising:

forming an insulating layer on a substrate;

forming an opening in the insulating layer, wherein the opening has a bottom portion overlying an exposed portion of the substrate and sidewall portions defined by the insulating layer;

forming a bottom conductive layer overlying the insulating layer and the bottom portion of the opening;

forming a diffusion barrier layer overlying at least a bottom portion of the bottom conductive layer and exposing a remaining portion of the bottom conductive layer;

annealing, with a nitrogen ambient, a portion of the diffusion barrier in the bottom portion of the opening; and forming a dielectric layer overlying the diffusion barrier layer and the bottom conductive layer, wherein the dielectric layer is adjacent the remaining portion of the bottom conductive layer.

2. The method of claim 1, further comprising:

forming a contact layer overlying the exposed portion of the substrate prior to forming the bottom conductive layer.

3. The method of claim 2, wherein the contact layer comprises a material selected from the group consisting of polysilicon, tungsten, titanium nitride, tungsten nitrides, tantalum nitride and aluminum.

4. The method of claim 1, wherein forming an opening in the insulating layer follows forming an insulating layer on a substrate;

wherein forming a bottom conductive layer follows forming an opening in the insulating layer;

wherein forming a diffusion barrier layer follows forming a bottom conductive layer; and wherein forming a dielectric layer overlying the diffusion barrier layer and the bottom conductive layer follows forming a diffusion barrier layer.

5. The method of claim 1, wherein forming a bottom conductive layer further comprises forming a conductive barrier layer overlying the insulating layer and the bottom portion of the opening and forming a primary conductive layer overlying the conductive barrier layer.

6. The method of claim 5, wherein forming a conductive barrier layer comprises forming a layer of metal nitride.

7. The method of claim 5, wherein forming a conductive barrier layer comprises forming a layer of metal nitride selected from the group consisting of titanium nitride, tungsten nitride and titanium aluminum nitride.

8. The method of claim 5, wherein forming a primary conductive layer comprises forming a layer of metal selected from the group consisting of refractory metals, the platinum group and the noble metals group.

9. The method of claim 5, wherein forming a primary conductive layer comprises forming a layer of metal alloy comprising at least one metal selected from the group consisting of refractory metals, the platinum group and the noble metals group.

10. The method of claim 5, wherein forming a primary conductive layer comprises forming a layer of a material selected from the group consisting of platinum, ruthenium oxide, iridium oxide and platinum-rhodium alloy.

11. The method of claim 1, wherein forming a diffusion barrier layer further comprises forming a layer containing material selected from the group consisting of silicon oxides, silicon nitrides, silicon oxynitrides and refractory metal nitrides.

12. A method of forming a semiconductor structure, comprising:
forming an insulating layer on a substrate;
forming an opening in the insulating layer, wherein the opening has a bottom portion overlying an exposed portion of the substrate and sidewall portions defined by the insulating layer;
forming a bottom conductive layer overlying the insulating layer and the bottom portion of the opening;
forming a diffusion barrier layer overlying at least a bottom portion of the bottom conductive layer and exposing a remaining portion of the bottom conductive layer;
forming a dielectric layer overlying the diffusion barrier layer and the bottom conductive layer, wherein the dielectric layer is adjacent the remaining portion of the bottom conductive layer; and
wherein forming a diffusion barrier layer further comprises forming a layer of material selected from the group consisting of silicon, silicon dioxide and refractory metals, and annealing the layer of material in a nitrogen-containing ambient.

13. The method of claim 1, wherein the forming a dielectric layer comprises forming a dielectric layer comprising at least one metal oxide.

14. The method of claim 1, wherein the forming a dielectric layer comprises forming a dielectric layer comprising at least one dielectric material selected from the group consisting of $Ba_xSr_{(1-x)}TiO_3$, $BaTiO_3$, $SrTiO_3$, $PbTiO_3$, $Pb(Zr,Ti)O_3$, $(Pb,La)(Zr,Ti)O_3$, $(Pb,La)TiO_3$, $Ta_2O_5$, $KNO_3$ and $LiNbO_3$.

15. A method of forming a semiconductor structure, comprising:
forming an insulating layer on a substrate;
forming an opening in the insulating layer, wherein the opening has a bottom portion overlying an exposed portion of the substrate and sidewall portions defined by the insulating layer;
forming a bottom conductive layer overlying the insulating layer and the bottom portion of the opening, wherein the bottom conductive layer comprises a primary conductive layer comprising at least one layer selected from the group consisting of a metal layer, a metal alloy layer and a conductive metal oxide layer;
forming a diffusion barrier layer overlying at least a portion of the bottom conductive layer, wherein the diffusion barrier layer comprises at least one material selected from the group consisting of silicon oxides, silicon nitrides, silicon oxynitrides and refractory metal nitrides;
annealing, in a nitrogen containing ambient, the diffusion barrier layer;
forming a dielectric layer overlying the diffusion barrier layer and the bottom conductive layer; and
forming a top conductive layer overlying the dielectric layer.

16. The method of claim 15, wherein forming an opening in the insulating layer follows forming an insulating layer on a substrate;
wherein forming a bottom conductive layer overlying the insulating layer and the bottom portion of the opening follows forming an opening in the insulating layer;
wherein forming a diffusion barrier layer overlying at least a portion of the bottom conductive layer follows forming an opening in the insulating layer;
wherein forming a dielectric layer follows forming a diffusion barrier layer overlying at least a portion of the bottom conductive layer; and
wherein forming a top conductive layer overlying the dielectric layer follows forming a dielectric layer.

17. The method of claim 15, wherein forming a diffusion barrier layer comprises forming a diffusion barrier layer adjacent the bottom portion of the bottom conductive layer, and wherein forming a dielectric layer comprises forming a dielectric layer adjacent the diffusion barrier layer and the sidewall portions of the bottom conductive layer.

18. The method of claim 15, wherein forming a bottom conductive layer farther comprises forming a conductive barrier layer overlying the insulating layer and the bottom portion of the opening and forming the primary conductive layer overlying the conductive barrier layer.

19. The method of claim 18, wherein forming a conductive barrier layer comprises forming a layer of metal nitride.

20. The method of claim 18, wherein forming a conductive barrier layer comprises forming a layer of metal nitride selected from the group consisting of titanium nitride, tungsten nitride and titanium aluminum nitride.

21. The method of claim 18, wherein the primary conductive layer comprises a material selected from the group consisting of platinum, ruthenium oxide, iridium oxide and platinum-rhodium alloy.

22. The method of claim 15, wherein the forming a dielectric layer comprises forming a dielectric layer comprising at least one metal oxide.

23. The method of claim 15, wherein the forming a dielectric layer comprises forming a dielectric layer comprising at least one dielectric material selected from the group consisting of $Ba_xSr_{(1-x)}TiO_3$, $BaTiO_3$, $SrTiO_3$, $PbTiO_3$, $Pb(Zr,Ti)O_3$, $(Pb,La)(Zr,Ti)O_3$, $(Pb,La)TiO_3$, $Ta_2O_5$, $KNO_3$ and $LiNbO_3$.

24. A method of forming a semiconductor structure, comprising:
forming an insulating layer on a substrate;
forming an opening in the insulating layer, wherein the opening has a bottom portion overlying an exposed portion of the substrate and sidewall portions defined by the insulating layer;
forming a bottom conductive layer overlying the insulating layer and the bottom portion of the opening;
forming a diffusion barrier layer overlying at least a bottom portion of the bottom conductive layer;
nitrogen ambient annealing the diffusion barrier layer; and
forming a dielectric layer overlying the diffusion barrier layer and the bottom conductive layer, wherein the dielectric layer comprises at least one metal oxide.

25. The method of claim 24, wherein wherein forming an opening in the insulating layer follows forming an insulating layer on a substrate;
wherein forming a bottom conductive layer overlying the insulating layer and the bottom portion of the opening follows forming an opening in the insulating layer;

wherein forming a diffusion barrier layer overlying at least a bottom portion of the bottom conductive layer follows forming a bottom conductive layer overlying the insulating layer and the bottom portion of the opening; and wherein forming a dielectric layer overlying the diffusion barrier layer and the bottom conductive layer follows forming a diffusion barrier layer overlying at least a bottom portion of the bottom conductive layer.

26. A method of forming a container capacitor, comprising:

forming an insulating layer on a substrate;

forming an opening in the insulating layer, wherein the opening has a bottom portion overlying an exposed portion of the substrate and sidewall portions defined by the insulating layer;

forming a contact layer overlying the exposed portion of the substrate, wherein the contact layer comprises polysilicon;

forming a metal layer overlying the contact layer and having a closed bottom portion and sidewall portions extending upward from the bottom portion;

forming a diffusion barrier layer comprising silicon overlying the metal layer;

removing a portion of the diffusion barrier layer, thereby forming a remaining portion of the diffusion barrier layer adjacent at least the bottom portion of the metal layer;

annealing the remaining portion of the diffusion barrier layer in a nitrogen-containing ambient, thereby converting at least a portion of the remaining portion of the diffusion barrier layer to silicon nitride;

forming a dielectric layer overlying the remaining portion of the diffusion barrier layer and the bottom conductive layer, wherein the dielectric layer comprises at least one dielectric material selected from the group consisting of $Ba_xSr_{(1-x)}TiO_3$, $BaTiO_3$, $SrTiO_3$, $PbTiO_3$, $Pb(Zr,Ti)O_3$, $(Pb,La)(Zr,Ti)O_3$, $(Pb,La)TiO_3$, $Ta_2O_5$, $KNO_3$ and $LiNbO_3$; and forming a top conductive layer overlying the dielectric layer.

27. A method of forming a container capacitor, comprising:

forming an insulating layer on a substrate;

forming an opening in the insulating layer, wherein the opening has a bottom portion overlying an exposed portion of the substrate and sidewall portions defined by the insulating layer;

forming a contact layer overlying the exposed portion of the substrate, wherein the contact layer comprises polysilicon;

forming a metal layer overlying the contact layer and having a closed bottom portion and sidewall portions extending upward from the bottom portion;

forming a diffusion barrier layer comprising silicon dioxide overlying the metal layer;

removing a portion of the diffusion barrier layer, thereby forming a remaining portion of the diffusion barrier layer adjacent at least the bottom portion of the metal layer;

annealing the remaining portion of the diffusion barrier layer in a nitrogen-containing ambient, thereby converting at least a portion of the remaining portion of the diffusion barrier layer to silicon oxynitride;

forming a dielectric layer overlying the remaining portion of the diffusion barrier layer and the bottom conductive layer, wherein the dielectric layer comprises at least one dielectric material selected from the group consisting of $Ba_xSr_{(1-x)}TiO_3$, $BaTiO_3$, $SrTiO_3$, $PbTiO_3$, $Pb(Zr,Ti)O_3$, $(Pb,La)(Zr,Ti)O_3$, $(Pb,La)TiO_3$, $Ta_2O_5$, $KNO_3$ and $LiNbO_3$; and forming a top conductive layer overlying the dielectric layer.

28. A method of forming a container capacitor, comprising:

forming an insulating layer on a substrate;

forming an opening in the insulating layer, wherein the opening has a bottom portion overlying an exposed portion of the substrate and sidewall portions defined by the insulating layer;

forming a contact layer overlying the exposed portion of the substrate, wherein the contact layer comprises polysilicon;

forming a metal layer overlying the contact layer and having a closed bottom portion and sidewall portions extending upward from the bottom portion;

forming a diffusion barrier layer comprising titanium overlying the metal layer;

removing a portion of the diffusion barrier layer, thereby forming a remaining portion of the diffusion barrier layer adjacent at least the bottom portion of the metal layer;

annealing the remaining portion of the diffusion barrier layer in a nitrogen-containing ambient, thereby converting at least a portion of the remaining portion of the diffusion barrier layer to titanium nitride;

forming a dielectric layer overlying the remaining portion of the diffusion barrier layer and the bottom conductive layer, wherein the dielectric layer comprises at least one dielectric material selected from the group consisting of $Ba_xSr_{(1-x)}TiO_3$, $BaTiO_3$, $SrTiO_3$, $PbTiO_3$, $Pb(Zr,Ti)O_3$, $(Pb,La)(Zr,Ti)O_3$, $(Pb,La)TiO_3$, $Ta_2O_5$, $KNO_3$ and $LiNbO_3$; and forming a top conductive layer overlying the dielectric layer.

29. A method of forming a container capacitor, comprising:

forming an insulating layer on a substrate;

forming an opening in the insulating layer, wherein the opening has a bottom portion overlying an exposed portion of the substrate and sidewall portions defined by the insulating layer;

forming a contact layer overlying the exposed portion of the substrate, wherein the contact layer comprises polysilicon;

forming a platinum layer overlying the contact layer and having a closed bottom portion and sidewall portions extending upward from the bottom portion;

forming a diffusion barrier layer comprising silicon overlying the platinum layer;

removing a portion of the diffusion barrier layer, thereby fanning a remaining portion of the diffusion barrier layer adjacent at least the bottom portion of the platinum layer;

annealing the remaining portion of the diffusion barrier layer in a nitrogen-containing ambient, thereby converting at least a portion of the remaining portion of the diffusion barrier layer to silicon nitride;

forming a dielectric layer overlying the remaining portion of the diffusion barrier layer and the bottom conductive layer, wherein the dielectric layer comprises at least one dielectric material selected from the group consisting of $Ba_xSr_{(1-x)}TiO_3$, $BaTiO_3$, $SrTiO_3$, $PbTiO_3$, $Pb(Zr,Ti)O_3$, $(Pb,La)(Zr,Ti)O_3$, $(Pb,La)TiO_3$, $Ta_2O_5$, $KNO_3$ and $LiNbO_3$; and forming atop conductive layer overlying the dielectric layer.

30. A method of forming a container capacitor, comprising:

forming an insulating layer on a substrate;

forming an opening in the insulating layer, wherein the opening has a bottom portion overlying an exposed portion of the substrate and sidewall portions defined by the insulating layer;

forming a contact layer overlying the exposed portion of the substrate, wherein the contact layer comprises polysilicon;

forming a platinum layer overlying the contact layer and having a closed bottom portion and sidewall portions extending upward from the bottom portion;

forming a diffusion barrier layer comprising silicon dioxide overlying the platinum layer;

removing a portion of the diffusion barrier layer, thereby forming a remaining portion of the diffusion barrier layer adjacent at least the bottom portion of the platinum layer;

annealing the remaining portion of the diffusion barrier layer in a nitrogen-containing ambient, thereby converting at least a portion of the remaining portion of the diffusion barrier layer to silicon oxynitride;

forming a dielectric layer overlying the remaining portion of the diffusion barrier layer and the bottom conductive layer, wherein the dielectric layer comprises at least one dielectric material selected from the group consisting of $Ba_xSr_{(1-x)}TiO_3$, $BaTiO_3$, $SrTiO_3$, $PbTiO_3$, $Pb(Zr,Ti)O_3$, $(Pb,La)(Zr,Ti)O_3$, $(Pb,La)TiO_3$, $Ta_2O_5$, $KNO_3$ and $LiNbO_3$; and forming a top conductive layer overlying the dielectric layer.

31. A method of forming a container capacitor, comprising:

forming an insulating layer on a substrate;

forming an opening in the insulating layer, wherein the opening has a bottom portion overlying an exposed portion of the substrate and sidewall portions defined by the insulating layer;

forming a contact layer overlying the exposed portion of the substrate, wherein the contact layer comprises polysilicon;

forming a platinum layer overlying the contact layer and having a closed bottom portion and sidewall portions extending upward from the bottom portion;

forming a diffusion barrier layer comprising titanium overlying the platinum layer;

removing a portion of the diffusion barrier layer, thereby forming a remaining portion of the diffusion barrier layer adjacent at least the bottom portion of the platinum layer;

annealing the remaining portion of the diffusion barrier layer in a nitrogen-containing ambient, thereby converting at least a portion of the remaining portion of the diffusion barrier layer to titanium nitride;

forming a dielectric layer overlying the remaining portion of the diffusion barrier layer and the bottom conductive layer, wherein the dielectric layer comprises at least one dielectric material selected from the group consisting of $Ba_xSr_{(1-x)}TiO_3$, $BaTiO_3$, $SrTiO_3$, $PbTiO_3$, $Pb(Zr,Ti)O_3$, $(Pb,La)(Zr,Ti)O_3$, $(Pb,La)TiO_3$, $Ta_2O_5$, $KNO_3$ and $LiNbO_3$; and forming a top conductive layer overlying the dielectric layer.

32. An integrated circuit fabrication method, comprising:

forming a conductive barrier layer to have a first closed bottom portion and first sidewall portions extending upwardly from the first closed bottom portion;

forming a bottom conductive layer to have a second closed bottom portion and second sidewall portions extending upwardly from the second closed bottom portion, wherein forming the bottom conductive layer includes forming the bottom conductive layer on the conductive barrier layer;

forming a diffusion barrier layer overlying at least the second closed bottom portion;

annealing, with a nitrogen ambient, a portion of the diffusion barrier layer; and forming a metal oxide, dielectric layer on the diffusion barrier layer and overlying the bottom conductive layer.

33. The method of claim 32, wherein forming the diffusion barrier layer includes forming the diffusion barrier layer in an integrated circuit memory device.

34. A method of forming a memory device, comprising:

forming an access device; and forming a memory cell operably connected to the access device, wherein forming the memory cell includes:

forming an insulating layer on a substrate;

forming an opening in the insulating layer, wherein the opening has a bottom portion overlying an exposed portion of the substrate and sidewall portions defined by the insulating layer;

forming a contact layer overlying the exposed portion of the substrate, wherein the contact layer comprises polysilicon;

forming a metal layer overlying the contact layer and having a closed bottom portion and sidewall portions extending upward from the bottom portion;

forming a diffusion barrier layer comprising silicon overlying the metal layer;

removing a portion of the diffusion barrier layer, thereby forming a remaining portion of the diffusion barrier layer adjacent at least the bottom portion of the metal layer;

annealing the remaining portion of the diffusion barrier layer in a nitrogen-containing ambient, thereby converting at least a portion of the remaining portion of the diffusion barrier layer to silicon nitride;

forming a dielectric layer overlying the remaining portion of the diffusion barrier layer and the bottom conductive layer, wherein the dielectric layer comprises at least one dielectric material selected from the group consisting of $Ba_xSr_{(1-x)}TiO_3$, $BaTiO_3$, $SrTiO_3$, $PbTiO_3$, $Pb(Zr,Ti)O_3$, $(Pb,La)(Zr,Ti)O_3$, $(Pb,La)TiO_3$, $Ta_2O_5$, $KNO_3$ and $LiNbO_3$; and forming a top conductive layer overlying the dielectric layer.

35. A method of forming a memory device, comprising:

forming an array of memory cells, each cell including an access transistor and a capacitor;

forming a row access circuit coupled to the array of memory cells;

forming a column access circuit coupled to the array of memory cells;
forming an address decoder circuit coupled to the row access circuit and the column access circuit; and
wherein forming the array of memory cells includes"
  forming an insulating layer on a substrate;
  forming an opening in the insulating layer, wherein the opening has a bottom portion overlying an exposed portion of the substrate and sidewall portions defined by the insulating layer;
  forming a contact layer overlying the exposed portion of the substrate, wherein the contact layer comprises polysilicon;
  forming a metal layer overlying the contact layer and having a closed bottom portion and sidewall portions extending upward from the bottom portion;
  forming a diffusion barrier layer comprising silicon dioxide overlying the metal layer;
  removing a portion of the diffusion barrier layer, thereby forming a remaining portion of the diffusion barrier layer adjacent at least the bottom portion of the metal layer;
  annealing the remaining portion of the diffusion barrier layer in a nitrogen-containing ambient, thereby converting at least a portion of the remaining portion of the diffusion barrier layer to silicon oxynitride;
  forming a dielectric layer overlying the remaining portion of the diffusion barrier layer and the bottom conductive layer, wherein the dielectric layer comprises at least one dielectric material selected from the group consisting of $Ba_xSr_{(1-x)}TiO_3$, $BaTiO_3$, $SrTiO_3$, $PbTiO_3$, $Pb(Zr,Ti)O_3$, $(Pb,La)(Zr,Ti)O_3$, $(Pb,La)TiO_3$, $Ta_2O_5$, $KNO_3$ and $LiNbO_3$; and forming a top conductive layer overlying the dielectric layer.

36. A method of forming a memory device, comprising:
forming an array of memory cells including an access transistor and a capacitor, wherein forming the array of memory cells includes:
  forming an insulating layer on a substrate;
  forming an opening in the insulating layer, wherein the opening has a bottom portion overlying an exposed portion of the substrate and sidewall portions defined by the insulating layer;
  forming a contact layer overlying the exposed portion of the substrate, wherein the contact layer comprises polysilicon;
  forming a metal layer overlying the contact layer and having a closed bottom portion and sidewall portions extending upward from the bottom portion;
  forming a diffusion barrier layer comprising titanium overlying the metal layer;
  removing a portion of the diffusion barrier layer, thereby forming a remaining portion of the diffusion barrier layer adjacent at least the bottom portion of the metal layer;
  annealing the remaining portion of the diffusion barrier layer in a nitrogen-containing ambient, thereby converting at least a portion of the remaining portion of the diffusion barrier layer to titanium nitride;
  forming a dielectric layer overlying the remaining portion of the diffusion barrier layer and the bottom conductive layer, wherein the dielectric layer comprises at least one dielectric material selected from the group consisting of $Ba_xSr_{(1-x)}TiO_3$, $BaTiO_3$, $SrTiO_3$, $PbTiO_3$, $Pb(Zr,Ti)O_3$, $(Pb,La)(Zr,Ti)O_3$, $(Pb,La)TiO_3$, $Ta_2O_5$, $KNO_3$ and $LiNbO_3$; and
  forming a top conductive layer overlying the dielectric layer;
forming a row access circuit coupled to the array of memory cells;
forming a column access circuit coupled to the array of memory cells; and forming an address decoder circuit coupled to the row access circuit and the column access circuit.

* * * * *

UNITED STATES PATENT AND TRADEMARK OFFICE
CERTIFICATE OF CORRECTION

PATENT NO. : 6,780,706 B2
DATED : August 24, 2004
INVENTOR(S) : Agarwal

It is certified that error appears in the above-identified patent and that said Letters Patent is hereby corrected as shown below:

Column 7,
Line 35, after "to" delete ",".
Line 46, delete "suicide" and insert -- silicide --, therefor.

Column 8,
Line 33, delete "suicide" and insert -- silicide --, therefor.

Column 16,
Line 62, delete "wherein" before "forming".

Column 18,
Line 59, delete "fanning" and insert -- forming --, therefor.

Column 19,
Line 6, delete "atop" and insert -- a top --, therefor.

Column 21,
Line 5, after "includes" delete """.

Signed and Sealed this

Eighth Day of February, 2005

JON W. DUDAS
*Director of the United States Patent and Trademark Office*